United States Patent
Rydén et al.

(10) Patent No.: US 12,034,461 B2
(45) Date of Patent: Jul. 9, 2024

(54) COMPRESSION AND DECOMPRESSION OF DELAY PROFILE

(71) Applicant: Telefonaktiebolaget LM Ericsson (publ), Stockholm (SE)

(72) Inventors: Henrik Rydén, Stockholm (SE); Roy Timo, Kungsängen (SE); Maksym Girnyk, Solna (SE); Hamed Farhadi, Stockholm (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 181 days.

(21) Appl. No.: 17/795,333

(22) PCT Filed: Mar. 6, 2020

(86) PCT No.: PCT/SE2020/050250
§ 371 (c)(1),
(2) Date: Jul. 26, 2022

(87) PCT Pub. No.: WO2021/177870
PCT Pub. Date: Sep. 10, 2021

(65) Prior Publication Data
US 2023/0109257 A1    Apr. 6, 2023

(51) Int. Cl.
*H03M 7/30*    (2006.01)
*G01S 5/00*    (2006.01)
(Continued)

(52) U.S. Cl.
CPC ............ *H03M 7/30* (2013.01); *G01S 5/0036* (2013.01); *H04L 25/0212* (2013.01);
(Continued)

(58) Field of Classification Search
CPC ........ H03M 7/30; H03M 7/3059; H03M 7/70; H04L 25/0212; H04L 25/0254; H04W 64/006; G01S 5/0036
(Continued)

(56) References Cited

U.S. PATENT DOCUMENTS 10,045,324 B2 *   8/2018   Zaidi ................... G01S 5/0036

FOREIGN PATENT DOCUMENTS

| WO | 2016186545 A1 | 11/2016 |
| WO | 2018083610 A1 | 5/2018 |
| WO | 2020180221 A1 | 9/2020 |

OTHER PUBLICATIONS

International Search Report and Written Opinion dated Nov. 6, 2020 for International Application No. PCT/SE2020/050250 filed Mar. 6, 2020; consisting of 13 pages.
(Continued)

*Primary Examiner* — Khai M Nguyen
(74) *Attorney, Agent, or Firm* — Weisberg I.P. Law, P.A.

(57) ABSTRACT

In a first method, a wireless device estimates a delay profile of a channel impulse response, CIR, for a channel between a network node and the wireless device, compresses the delay profile using a compression function, and transmits the compressed delay profile. The compression function includes a first function and a quantizer. The first function is configured to receive input data and reduce a dimension of the input data. In a second method, a network node receives a compressed delay profile of CIR for a channel between a network node and a wireless device, decompresses the compressed delay profile using a decompression function, and estimates a position of the wireless device based on at least the decompressed delay profile. The decompression function includes a first function which is configured to
(Continued)

receive input data and provide output data in a higher dimensional space than the input data.

20 Claims, 16 Drawing Sheets

(51) Int. Cl.
*H04L 25/02* (2006.01)
*H04W 64/00* (2009.01)

(52) U.S. Cl.
CPC ....... *H04L 25/0254* (2013.01); *H03M 7/3059* (2013.01); *H03M 7/70* (2013.01); *H04W 64/006* (2013.01)

(58) Field of Classification Search
USPC .......................................................... 341/50
See application file for complete search history.

(56) References Cited

OTHER PUBLICATIONS

Wen, Chao-Ken, et al.; Title: Deep Learning for Massive MIMO CSI Feedback; Mar. 4, 2018; consisting of 5 pages.
3GPP TS 36.305 V15.4.0; 3rd Generation Partnership Project; Technical Specification Group Radio Access Network: Evolved Universal Terrestrial Radio Access Network (E-UTRAN); Stage 2 functional specification of User Equipment (UE) positioning in E-UTRAN (Release 15); Jun. 2019; consisting of 91 pages.
3GPP TS 36.355 V14.2.0; 3rd Generation Partnership Project; Technical Specification Group Radio Access Network: Evolved Universal Terrestrial Radio Access (E-UTRA); LTE Positioning Protocol (LPP) (Release 14); Jun. 2017; consisting of 167 pages.
Liao, Yong, et al.; Title: CSI Feedback Based on Deep Learning for Massive MIMO Systems; IEEE Access; Special Section on Artificial Intelligence for Physical-Layer Wireless Communications; vol. 7, 2019; Jun. 24, 2019; consisting of 11 pages.

* cited by examiner

COMPRESSION AND DECOMPRESSION OF DELAY PROFILE

CROSS-REFERENCE TO RELATED APPLICATIONS

This application is a Submission Under 35 U.S.C. § 371 for U.S. National Stage Patent Application of International Application Number: PCT/SE2020/050250, filed Mar. 6, 2020 entitled "COMPRESSION AND DECOMPRESSION OF DELAY PROFILE," the entirety of which is incorporated herein by reference.

TECHNICAL FELD

The present disclosure generally relates to wireless communication technology, and more specifically to compression and decompression of delay profiles for estimation of a position of a wireless device.

BACKGROUND

Location-based services and emergency call positioning drives the development of positioning in wireless networks and a plethora of applications and services in wireless devices or terminals take advantage of the position. Positioning in Long Term Evolution (LTE) is supported by the architecture in FIG. 1, with direct interactions between a wireless device, exemplified herein by a User Equipment (UE), and a location server (also called evolved Serving Mobile Location Center E-SMLC) via the LTE Positioning Protocol (LPP). Moreover, there are also interactions between the location server and the evolved Node B (eNodeB or eNB) via the LPPa protocol, to some extent supported by interactions between the eNodeB and the UE via the Radio Resource Control (RRC) protocol.

The following positioning techniques are considered in LTE (see for example Third Generation Partnership Project (3GPP) technical specification (TS) 36.305 v15.4.0). Enhanced Cell ID includes essentially cell ID information to associate the UE to the serving area of a serving cell, and then additional information to determine a finer granularity position. Assisted Global Navigation Satellite System (GNSS) includes GNSS information retrieved by the UE, supported by assistance information provided to the UE from E-SMLC. For Observed Time Difference of Arrival (OTDOA), the UE estimates the time difference of reference signals from different base stations and sends this to the E-SMLC for multilateration. For uplink Time Difference of Arrival (uplink TDOA), the UE is requested to transmit a specific waveform that is detected by multiple location measurement units (for example eNodeBs) at known positions. These measurements are forwarded to E-SMLC for multilateration In the abovementioned positioning methods, it is important to estimate the time-of-arrival (TOA) of a signal at the receiver node from a sender node. The TOA information can be combined to form measurements that supports the following different fundamental positioning methods. The difference between two TOAs iron two different sender nodes may be employed to form a time difference of arrival measurement, for example downlink Time Difference of Arrival (downlink TDOA). The difference between two TOAs obtained at two different receiver nodes, based on a signal iron a specific sender node, may be employed to form a time difference of arrival measurement, for example uplink TDOA The difference between the TOA at a node and the subsequent transmission time (which indicates the processing time of a node), as well as the difference between a TOA at a node and a previous transmission time (which indicates the total round-trip time), form components in a ranging procedure.

The abovementioned TOA-based approaches translate measurements into distances and relative distances based on the signal propagation velocity in the considered medium.

In a general scenario illustrated by FIG. 2, a UE A is served/controlled by a serving/controlling node. In addition, the UE can possibly detect a signal from one or more non-serving/non-controlling nodes. The UE estimates the TOA of a signal from one node, possibly subject to an interfering signal from another node within coverage or communication range. Alternatively, significant interfering signals from other nodes may be avoided by employing a muting scheme where nodes alternating transmission and muting according to a schedule.

The scenario may also be reversed, where TOA is estimated in a node, based on a signal from a UE A, possibly subject to interference iron a signal iron a different UE B. Moreover, the scenario may also be a UE A estimating a TOA based on a signal from a different UE, or a node estimating TOA based on a signal from a different node.

For example, the Observed Time Difference Of Arrival (OTDOA) is a UE-assisted method, in which the UE measures the time of arrival (TOA) of specific positioning reference signals (PRS) from multiple cells (such as eNBs), and computes the relative differences between each cell and a reference cell. These reference signal time difference (RSTD) are quantized and reported via LPP to the E-SMLC together with an accuracy assessment Based on known positions of eNBs and their mutual time synchronization, it is possible for the E-SMLC to estimate the UE position from the RSTD and covariance reports using multilateration. The accuracy depends on the radio conditions of the received signals, the number of received signals as well as the deployment, which means that it will vary spatially. FIG. 3 illustrates the multilateration in OTDOA while considering eNB1 as the reference cell.

One of the factors which significantly impacts on the performance of OTDOA, is the assumptions on the UE receiver model and how it estimates the TOA.

How to Determine TOA?

Wireless channels are usually modelled as multipath channels, meaning that the receiving node receives several distorted and delayed copies of the transmitted signal through multiple reflections, diffraction, etc. The multi-path effect can be modelled by considering the following tapped delay link channel.

$$h(t) = \sum_{l=0}^{L} a_l \delta(t - \tau_l)$$

In the above equation, L is the number of multipath taps (that is, the number of signals received at the UE), $a_l$ denotes the complex attenuation of the l-th tap (that is, attenuation of the l-th signal received), $\tau_l$ indicates the time delay of the l-th tap and $\delta(t)$ is the delta function, which is one when t=0 and zero otherwise. In order to determine geographical distance between the transmitter and receiver antennas, one should measure $\tau_0$ (time delay corresponding to line-of-sight (LOS) tap) and scale it with the speed of light.

TOA of the signal can be measured based on a reference signal that is known to the receiver. Assume, for example, that the transmitted signal is denoted as "x(t)", then the received signal "y(t)" subject to multipath channel is given by $$y(t) = \sum_{l=0}^{L} a_l x(t - \tau_l) + w(t)$$

In the above equation, w(t) models additive noise and interference. Based on the received signal y(t) and the prior knowledge of the transmitted reference signal x(t), the receiver is interested in computing time delay of the first channel tap $\tau_0$ (that is, TOA of the LOS signal or the signal that arrives earliest if there is no LOS, since that translates to the distance between transmitter and receiver). However, since the received signal is embedded in noise and interference, it is not always easy to determine the first channel tap if it is not strong enough, which is usually the case in the indoor scenarios.

There can be different methods to determine TOA at the receiver. A simple and widely used method is to cross-correlate the received signal with the known transmitted reference signal, $$R[\tau] = \sum_{i=0}^{K} y[i]x^*[i - \tau].$$

In the above equation, K is the length of the received signal discrete domain representation. The cross-correlation function R[τ] gives channel impulse response (CIR). The squared absolute value of R[τ] corresponds to the Power Delay Profile (PDP) of the channel. The next step is to determine the first channel tap, which can for example be estimated by determining the first peak in R[τ] that is above a certain threshold.

$$\hat{\tau} = \operatorname{argmin}\left\{\frac{|R[\tau]|}{\max\{|R|\}} \geq \zeta\right\}.$$

Finding the LOS component based on the cross-correlation, as described above, is not an easy task for a UE. The UE needs to find a proper threshold; in order to find the LOS component since the LOS tap is typically not the strongest tap. If the threshold is too low, the receiver can falsely detect noise as first channel tap and if the threshold is too high, the receiver may miss a weak LOS signal. Therefore, there is typically a trade-off between LOS detection and robustness to noise. For example, FIGS. 4 and 5 show situations where a threshold (the horizontal solid line in the figures) based UE fails to estimate a proper TOA, indicating the problems associated with a threshold based peak detection. FIG. 4 illustrates an example situation where having a lower threshold value would have improved the TOA estimation considerably. FIG. 5 illustrates an example situation where having a higher threshold value would have improved the TOA estimation considerably.

In RAN1#86bis, it has been agreed that multipath RSTD feedback can be reported for up to 2 peaks of each cell to improve the issue described above.

Additional Peaks Reporting for Downlink Positioning

Downlink positioning is based on UE time of arrival (TOA) estimation of positioning reference signals (PRSs) from a reference and neighboring cells. The UE receiver may detect several occurrences or correlation peaks from a specific cell over a time window, and the UE tries to identify the reference peak as the most likely line of sight (LOS) peak. Peaks later in time are considered to be due to non-line of sight (NLOS) propagation and peaks earlier in time are considered to be due to due to noise. The additional peaks reporting (see for example 3GPP TS 36.355 v14.2.0 section 6.5.1.6) enables capable UEs to also report such additional peaks from reference and/or neighboring cells.

One example illustrating a possible situation at the UE receiver with both a reference peak and additional peaks from a reference cell and a neighbor cell is shown in FIG. 6. The UE receiver has detected multiple TOA peaks for both the reference cell and a neighbor cell i. For the reference cell and the neighbor cell, the UE estimates reference peak TOA $t_0$ and $t_i$ respectively. The Reference Signal Time Difference (RSTD) is determined by the UE as the time difference between these reference peaks. The reference peak can be selected based on different strategies, such as the peak with the highest likelihood to be a relevant first peak, or the first peak among the detected peaks. The selection of the reference peak is implementation specific.

In addition, there are additional peaks in FIG. 6, which are represented by the relative time difference to the reference peak. For the reference cell in FIG. 6 with the reference peak TOA $\tau_0$ and TOA of additional peaks $t_{0,1}$ and $t_{0,2}$, the additional peaks are represented by the relative time differences $\delta_{0,1}=t_{0,1}-t_0$ and $\delta_{0,2}=t_{0,2}-\tau_o$. Similarly, for the neighbor cell i in FIG. 6 with the reference peak TOA $t_i$ and TOA of additional peaks $t_{i,1}$ and $t_{i,2}$, additional peaks are represented by the relative time differences $\delta_{i,1}=t_{i,1}-t_i$ and $\delta_{i,2}=t_{i,2}-t_i$.

Map-Based Positioning

In map-based positioning, the network combines map information (in other words, information about the environment) with channel information to provide a position estimate. In map-based positioning, a single node can for example perform the triangulation based on the reflections in the environment in comparison to traditional algorithms that typically require measurements from multiple nodes. FIG. 7 shows an example of map-based positioning.

Conclusion

As described above, several ways have been proposed for how the position of a wireless device (such as a UE) may be estimated. The reliability of such positioning estimates may depend on factors such as a noise level (for example caused by other wireless devices or network nodes), non-Line-Of-Sight paths (for example caused by buildings or other obstacles in the environment), and device capabilities (for example capabilities of wireless devices and/or network nodes involved in the positioning). Moreover, device performance and/or network performance may be affected if wireless devices and/or network nodes devote too much resources to positioning-related tasks. In order to address one or more of these issues, it would be desirable to provide new ways to estimate the position of a wireless device.

SUMMARY

Embodiments of methods, wireless devices, network nodes, etc. are provided herein for addressing one or more of the abovementioned issues.

A first aspect provides embodiments of a method performed by a wireless device. The method comprises estimating a delay profile of a channel impulse response (CIR) for a channel between a network node and the wireless device, compressing the delay profile using a compression function, and transmitting the compressed delay profile. The compression function comprises a first function and a quantizer. The first function is configured to receive input data, and to reduce a dimension of the input data.

It will be appreciated that the compression function is employed to convert or transform the delay profile into a compressed format or representation.

A second aspect provides embodiments of a method performed by a network node. The method comprises receiving a compressed delay profile of a CIR for a channel between a network node and a wireless device, decompressing the compressed delay profile using a decompression function, and estimating a position of the wireless device based on at least the decompressed delay profile. The decompression function comprises a first function. The first function is configured to receive input data, and to provide output data in a higher dimensional space than the input data.

It will be appreciated that the decompression function is employed to reconstruct or recreate the delay profile iron the compressed format or representation. It will also be appreciated that this recreation or reconstruction may not be perfect. In other words, the decompressed delay profile (in other words, delay profile as reconstructed or recreated at the network node) may deviate iron the original delay profile which was compressed before being received by the network node.

A third aspect provides embodiments of a wireless device. The wireless device is configured to estimate a delay profile of a CIR for a channel between a network node and the wireless device, compress the delay profile using a compression function, and transmit the compressed delay profile. The compression function comprises a first function, and a quantizer. The first function is configured to receive input data, and to reduce a dimension of the input data.

The wireless device may for example be configured to perform the method as defined in any of the embodiments of the first aspect disclosed herein (in other words, in the claims, or the summary, or the detailed description, or the drawings).

The wireless device may for example comprise processing circuitry and at least one memory. The at least one memory may for example contain instructions executable by the processing circuitry whereby the wireless device is operable to perform the method as defined in any of the embodiments of the first aspect disclosed herein.

A fourth aspect provides embodiments of a network node. The network node is configured to receive a compressed delay profile of a CIR for a channel between a network node and a wireless device, decompress the compressed delay profile using a decompression function, and estimate a position of the wireless device based on at least the decompressed delay profile. The decompression function comprises a first function. The first function is configured to receive input data, and to provide output data in a higher dimensional space than the input data.

The network node may for example be configured to perform the method as defined in any of the embodiments of the second aspect disclosed herein (in other words, in the claims, or the summary, or the detailed description, or the drawings).

The network node may for example comprise processing circuitry and at least one memory. The at least one memory may for example contain instructions executable by the processing circuitry whereby the network node is operable to perform the method as defined in any of the embodiments of the second aspect disclosed herein.

The effects and/or advantages presented in the present disclosure for embodiments of the method according to the first aspect may also apply to corresponding embodiments of the method according to the second aspect, the wireless device according to the third aspect, and the network node according to the fourth aspect. Similarly, the effects and/or advantages presented in the present disclosure for embodiments of the method according to the second aspect may also apply to corresponding embodiments of the method according to the first aspect, the wireless device according to the third aspect, and the network node according to the fourth aspect.

It is noted that embodiments of the present disclosure relate to all possible combinations of features recited in the claims.

BRIEF DESCRIPTION OF THE DRAWINGS

In what follows, example embodiments will be described in greater detail with reference to the accompanying drawings, on which.

All the figures are schematic, not necessarily to scale, and generally only show parts which are necessary in order to elucidate the respective embodiments, whereas other parts may be omitted or merely suggested. My reference number appearing in multiple drawings refers to the same object or feature throughout the drawings, unless otherwise indicated.

DETAILED DESCRIPTION

Figure 1:
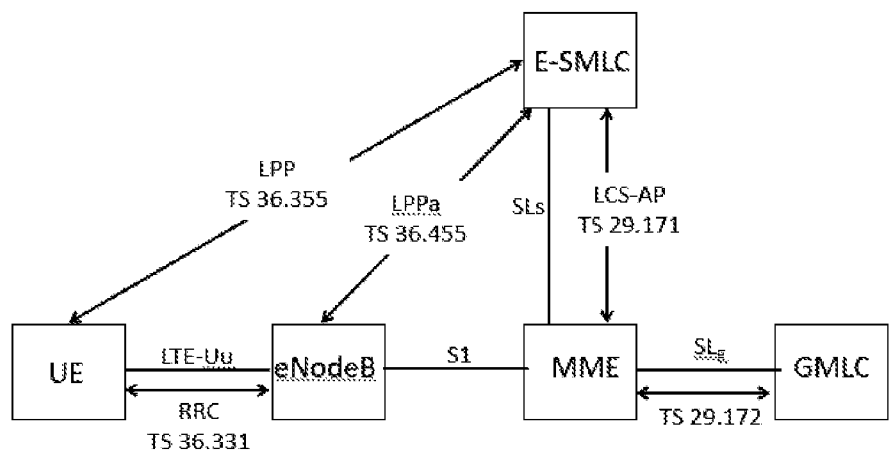
FIG. 1 shows an example LTE positioning architecture.
Figure 2:
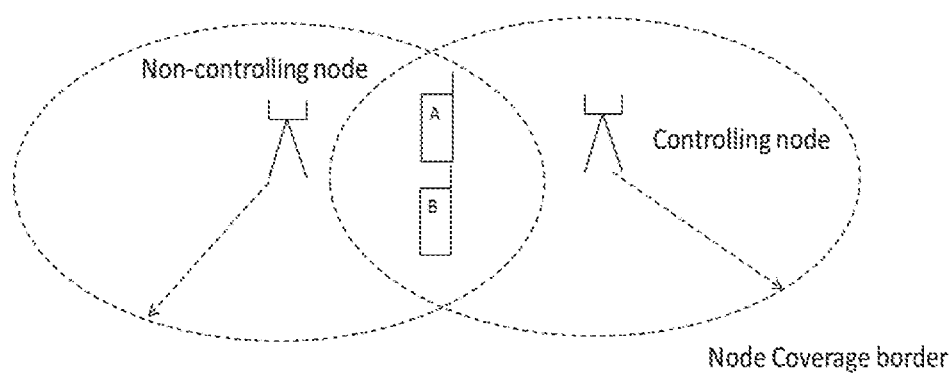
FIG. 2 shows a UE served by a controlling node, and which is capable of detecting signals both from the controlling node and a non-controlling node.
Figure 3:
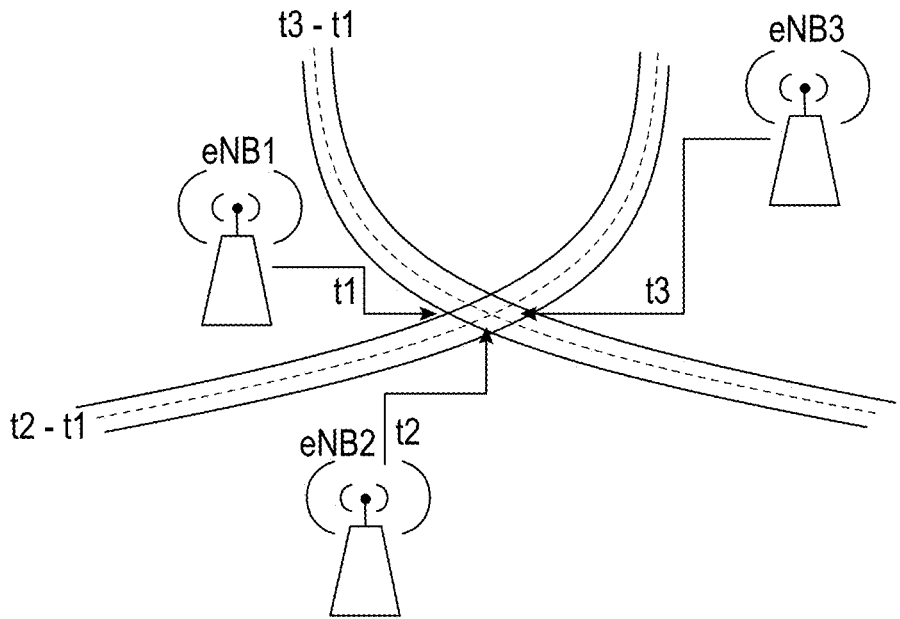
FIG. 3 shows OTDOA position estimation based on multilateration of RSTD measurements.
Figure 4:
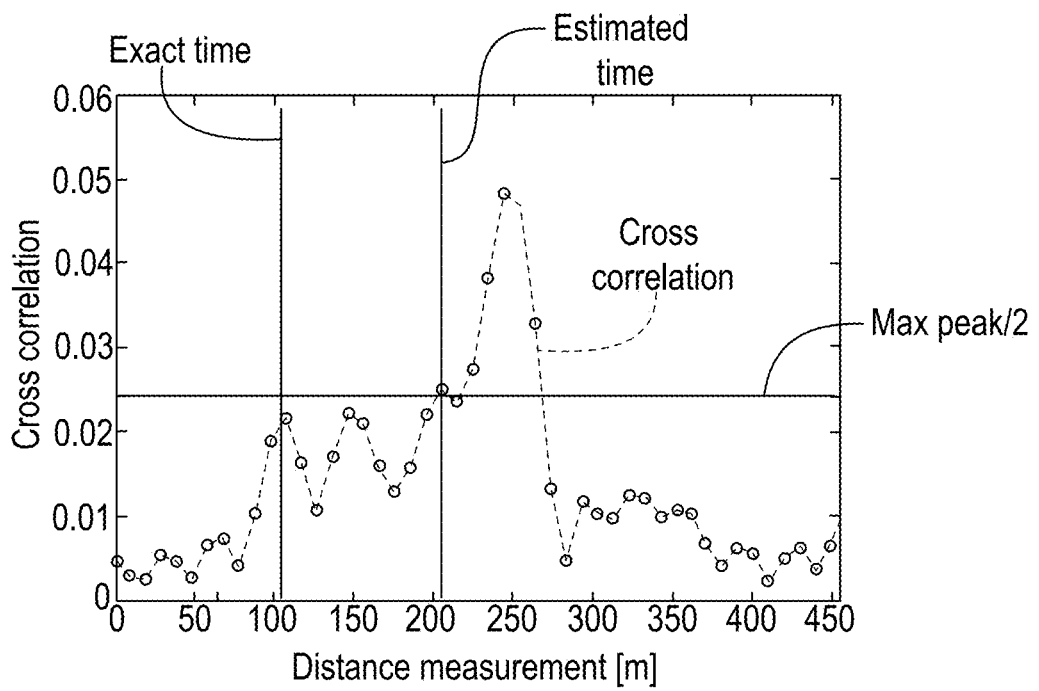
FIG. 4 shows an example situation where having a lower threshold value would have improved the TOA estimation considerably.
Figure 8:
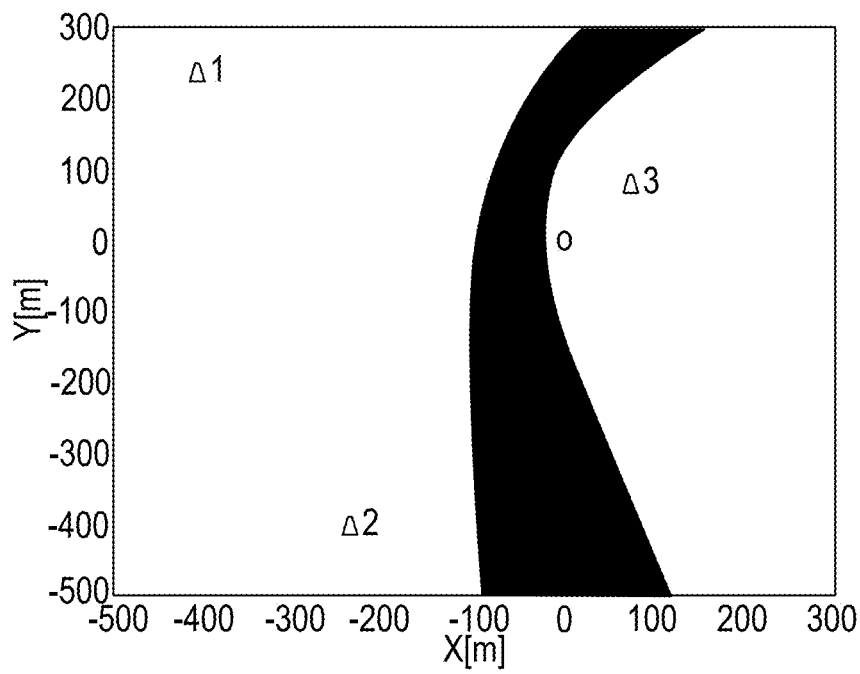
FIG. 8 shows likelihood based on thresholded TOA to generate RSTD.
Figure 32:
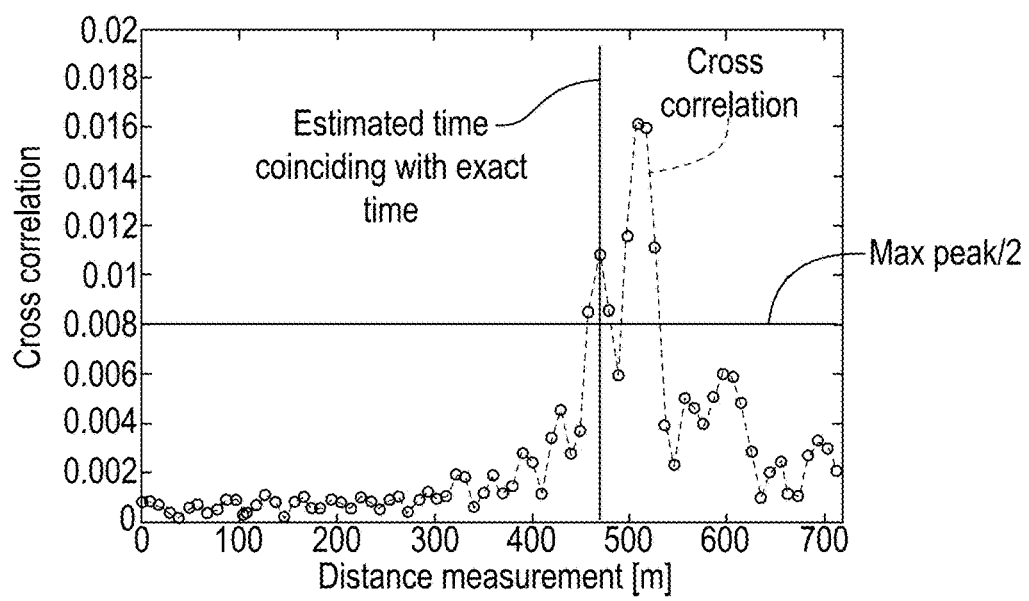
FIG. 32 shows an example situation where a threshold value leads to an accurate TOA estimation.

To illustrate the benefits of a detailed error distribution (such as the additional peaks reporting described above in the background section), consider the situation in FIG. 3 and use cell 3 as reference cell, where we assume that TOA of cell 3 is estimated using the amplitude delay profile in FIG. 4, and TOA of cell 1 is estimated using the amplitude delay profile in FIG. 32. When estimating the TOA, we assume a conventional detector that estimates the delay that is associated with the tap that is more than half of the strongest tap. This is shown by the estimated timeline in FIGS. 4 and 32 (where the estimate is accurate in FIG. 32 but inaccurate in FIG. 4). If we compile the error distribution based on thresholded TOA, the reference signal time difference (RSTD) will be subject to a 100 m bias due to the error indicated in FIG. 4. The resulting spatial likelihood of the RSTD between cell 1 and 3 is illustrated by FIG. 8, where a large likelihood corresponds to a dark color and vice versa. The true UE position is marked by 'o'. Clearly, the bias in the measurement due to the incorrect peak selection in the UE causes the error representation to fail to model the true error.

Figure 9:
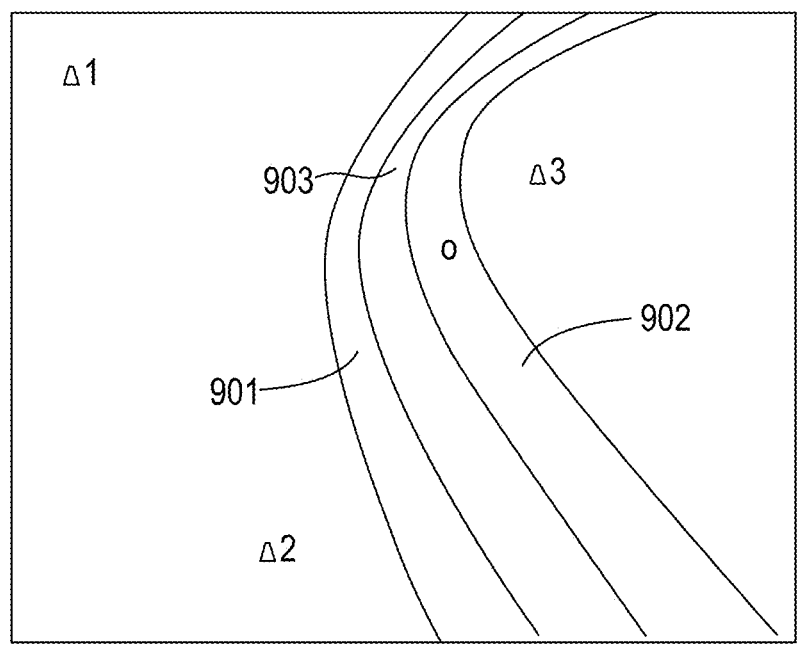
FIG. 9 shows likelihood based on rich RSTD error representation.

If we instead consider the positioning reference signals (PRS) correlation function characteristics feedback, then all significant peaks in FIG. 4 are represented, also the true one corresponding to no bias. As seen in FIG. 9, the true position of the UE is now covered by the error representation. In FIG. 9, there is a high probability/likelihood region 901 and a medium likelihood region 902, separated by a low likelihood region 903. Note that in contrast to FIG. 8, dark color does not indicate high likelihood in FIG. 9 and light color does not indicate low likelihood in FIG. 9.

With the more precise error representation, a positioning algorithm striving to maximize the likelihood will be more capable of finding an accurate position estimate than an algorithm using a crude error representation. Note that, in the present example, the most likely position estimates are those that correspond to the biased peaks, but the true position corresponds to non-negligible likelihood.

Also for map-based positioning (described above in the background section) accurate channel feedback iron the UE may be needed in order to reach high precision positioning.

The use of multipath reporting (described above in the background section) is limited to two additional peaks since (3 peaks in total) since LTE Release 16. This can be too few peaks in high multipath scenarios. Also, in high interference scenarios situations, the risk of only reporting interference peaks increases, and the absence of valid peaks in the reporting reduces the positioning accuracy. Using a more detailed report, of for example the complete CIR, may increase the positioning accuracy. However, the downside is a very large reporting overhead. In general, there is a trade-off between reporting overhead and positioning accuracy.

In the current solution of reporting up to two additional peaks, it is up to the implementation of each wireless device to select peaks. Two wireless devices (exemplified herein by UEs) in the same scenario may for example report different peaks, leading to uncertainty at the location server. Also, some wireless devices might have good interference peak detection while some other wireless devices might have less capability to classify a peak as interference.

As described above, in map-based positioning, the accuracy is dependent on an accurate channel report. However, it may also be desirable to minimize the reporting overhead, so a method for efficient channel reporting is desirable.

Similarly, in uplink-based positioning, a scheme to efficiently report channel properties between cells, or to a central entity, is also desirable.

Figure 10:
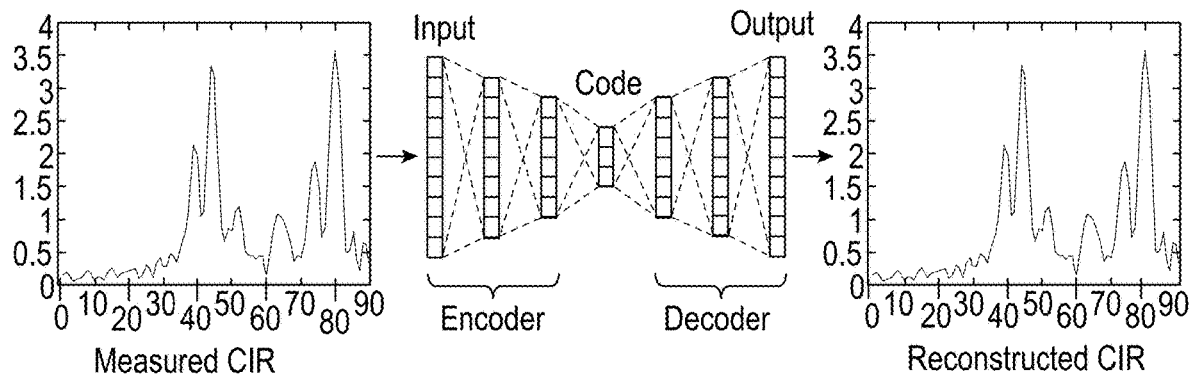
FIG. 10 shows an example compression process, where, at the UE side, the measured CIR is fed into an encoder that compresses it to a code that is reported to the network node which uses an appropriate decoder to reconstruct the CIR for further localization.

An autoencoder may be employed to compress data such as a Channel impulse response (CIR). An autoencoder is a type of neural network used to learn efficient data representations. One example of an autoencoder comprising an encoder/decoder for data compression is shown in FIG. 10. In FIG. 10, the absolute values of the CIR are compressed to a code, and the code is decoded to reconstruct the measured CIR absolute values.

In the present disclosure, a framework is proposed for using compression (for example in the form of encoders and decoders) for enhanced positioning accuracy while minimizing reporting overhead. Some embodiments include the following steps. In step 1, a network node trains an autoencoder for compression (for example for compression of a delay profile of a CIR, such as a power delay profile of a CIR). In step 2, a wireless device (exemplified herein by a UE) is configured with one or more autoencoders, based on step 1. In step 3, the UE receives signals and estimates a CIR for one or more network nodes (or base stations). In step 4, the UE encodes (or compresses) the estimated CIR (or a delay profile of the CIR) using the autoencoder. In step 5, the UE reports the code(s) (in other words, the compressed CIR or the compressed delay profile of the CIR), for example together with additional reporting information. In step 6, the network node receives the UE report, reconstructs the CIR (or the delay profile of the CIR) and performs localization. This may for example be described as efficient positioning using Chanel State Information (CSI) compression. UEs may report a coded/compressed CSI (for example a compressed delay profile of a CIR), leading to better location accuracy at the network node due to higher probability in capturing a possible weak LOS peak, while limiting the reporting overhead. Also, UEs may report in a predictable fashion, leading to improved network control and potentially improved localization.

In the uplink scenario (in contrast to the downlink scenario described above) a network node is a central entity (for example a location server). Multiple network nodes may receive uplink signals from a UE and may transmit compressed CIR delay profiles to the central entity where the localization (in other words, determination of a position of the UE) may be performed.

Autoencoder

The autoencoder could for example be trained by having wireless devices (exemplified herein by UEs) signaling their full CIR (or their full CIR delay profile) in addition to the compressed CIR (or the compressed CIR delay profile). Alternatively or additionally, if we have channel reciprocity (or something close enough), then training data could also be obtained from UE uplink reference signals. The autoencoder could also be trained using simulated data with channel models such as International Telecommunication Union (ITU) typical urban.

The UE may for example receive the encoder (which is also referred to as a compression function) in order to compress the CSI (such as the CIR delay profile), while the decoder (which is also referred to as a decompression function) may be located in the network node. The encoder could be sent from the location server to the UE using the LTE Positioning Protocol (LPP). The encoder could also be sent via RRC from the UE serving cell to the UE. The UE could also be preconfigured with an encoder.

In some embodiments, the UE may be equipped with an encoder (or compression function) with a general configuration, for example trained on an aggregated dataset from multiple deployment scenarios (real data or simulations) or averaging the configurations adjusted to different scenarios.

In some embodiments, the UE may be configured with or may receive multiple encoders (or compression functions). In this case, an entity may be implemented at the UE for identifying the existing scenario. This may for example be implemented by performing classification based on one or more features. M appropriate encoder would then be selected from the list of encoders based on the outcome of this classification. In this case, the UE may inform the network node about which encoder is used (for example by sending the indices of the encoder). This may for example be included as reporting of information in connection with step 4 and/or step 5 described above. The network node may then choose an appropriate decoder (or decompression function).

The autoencoders could be trained for different scenarios, for example depending on delay spread and/or bandwidth, and/or cell size—micro/macro cell, and/or signal to noise ratio (SNR).

The autoencoder could also detail different number of encoding (or compression) layers. More encoding layers enables better reconstruction of the CIR (as described below with reference to FIG. 13), with the drawback of more reporting overhead.

Encoding/Compression of Channel State Information (CSI)

In case of multiple encoders (or compression functions) at the UE, the UE could receive an index from the location server of what encoder it should use for each network node. For example, one encoder (or compression function) may be trained for close-by micro cell which may have a different power delay profile (PDP) compared to a distant macro-cell (for which a second encoder may be trained).

The UE could also in one embodiment receive the decoder(s) from the location server, or the decoder(s) may be preconfigured at the UE. The UE can then also estimate the model uncertainty of the compressed CSI (or the compressed CIR delay profile). The model uncertainty can be estimated by using mean squared error between the input (the CIR) and the output (the reconstructed CIR). The UE may then select the encoder/decoder with lowest uncertainty. Or in case the uncertainty is high for all encoder/decoders, the UE may use legacy reporting.

The UE could also receive an indication whether it should report one encoded CSI per receiver antenna, or one combined compressed CSI report. The UE could, for example, perform averaging of the antennas power-delay-profile (PDP), and compress the averaged PDP.

Figure 5:
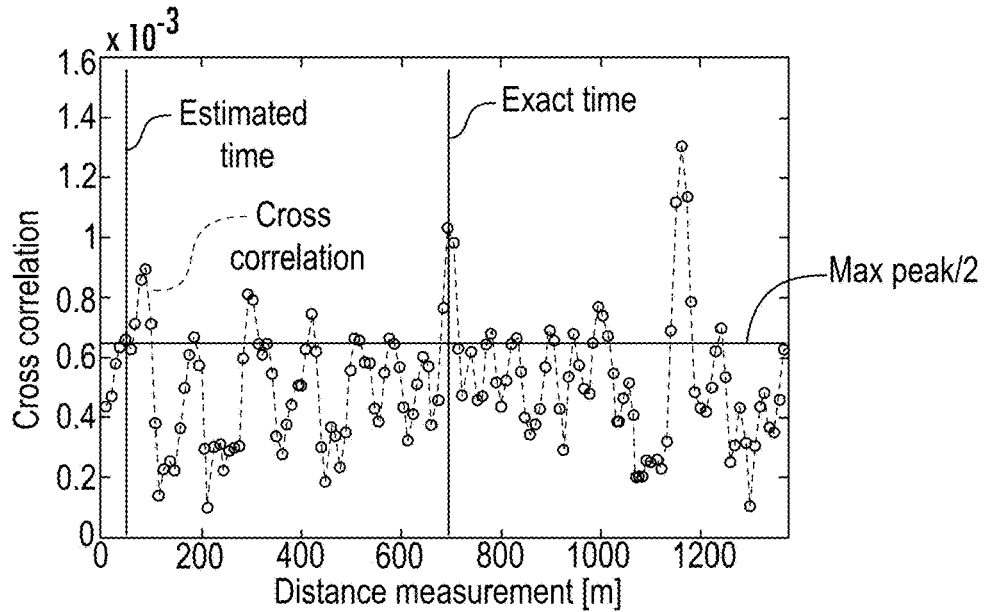
FIG. 5 shows an example situation where having a higher threshold value would have improved the TOA estimation considerably.
Figure 6:
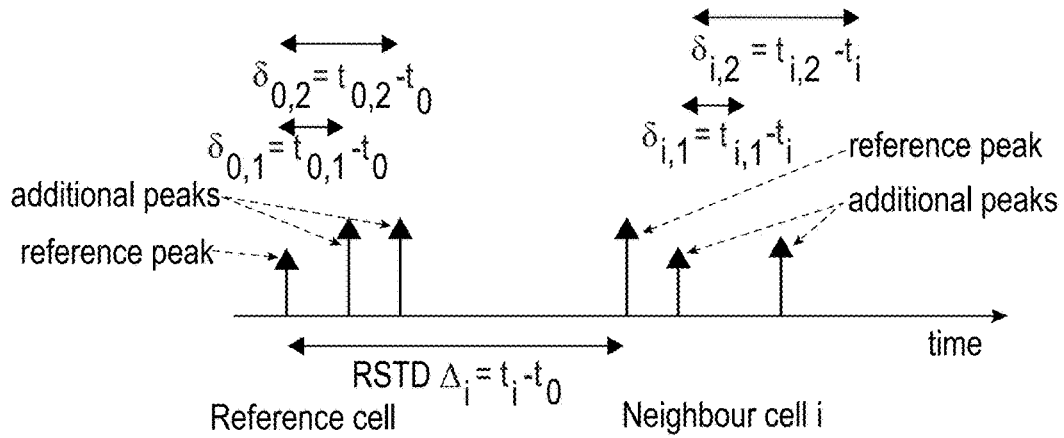
FIG. 6 shows a reference peak and additional peaks in the received positioning reference signals from a reference cell and the neighbor cell.
Figure 7:
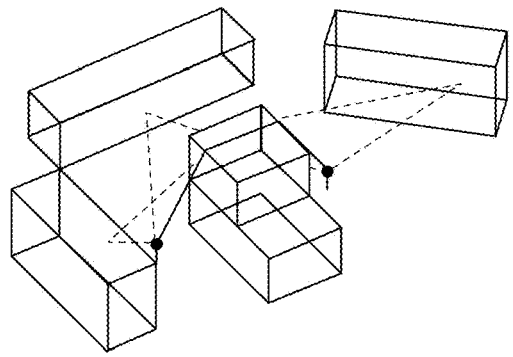
FIG. 7 shows an example of map-based positioning.

In some embodiments, the UE could receive a signal quality threshold determining when the UE should use the encoder (or compression function). In scenarios with low-SNR (as shown in FIG. 5), there is only a few valid peaks, and the UE could instead switch to the legacy reporting format.

The number of peaks can also depend on how rich/complicated the propagation environment is. If the propagation environment is rich (for example many scatters and many signal reflections, for example urban scenarios), then a large number of signal copies may be received, and hence more peaks will be observed in the autocorrelation. Therefore, switching between the CIR compression and legacy report format can be made also by taking into account the type of the propagation environment. The UE can use the legacy reporting format if for example three or less significant peaks are detected.

UE Report—Compressed CIR Start Difference

The location server needs to know the time-differences of the received signals in order to perform the positioning. One method is to use CIR compression over a large time-window covering all signal time arrivals. That would however lead to compression over a large time-window, which would lead to increased complexity in the autoencoder and the receiver. Therefore, in addition to the compressed CIR delay profile, the UE may also report the compressed CIR start time difference between reference and neighboring cell. This is exampled in FIG. 11 for a neighboring (node 2) and reference cell (node 1).

UE Retort—Compression Uncertainty

In some embodiments, the UE could receive the decoder (or decompression function) from the location server. The UE could then also estimate the model uncertainty of the compressed CIR delay profile and report the uncertainty to the location server. The model uncertainty may for example be estimated by using mean squared error between the input (CIR) and the output (reconstructed CIR). The UE may for example select the encoder/decoder with lowest uncertainty and may report the index of the used decoder to the location server.

In some embodiments, the UE may report the signal quality (for example SNR) for each network node. This may provide an indication of the compression uncertainty since typically the compression improves with the SNR Estimation of Position A network node (such as a location server) first decompresses the UE transmitted compressed CSI (such as a delay profile of the CIR), and estimates the position/location of the UE using the decompressed CSI for each node and the compressed CSI start differences iron the UE report. The network node (such as a location server) can estimate the location of the UE using for example the likelihood approach shown in FIGS. 8 and 9.

In some embodiments, the network node (for example the location server) performs localization using the received compressed CSI (for example a delay profile of a CIR) and map information.

Autoencoder Examples

Figure 12:
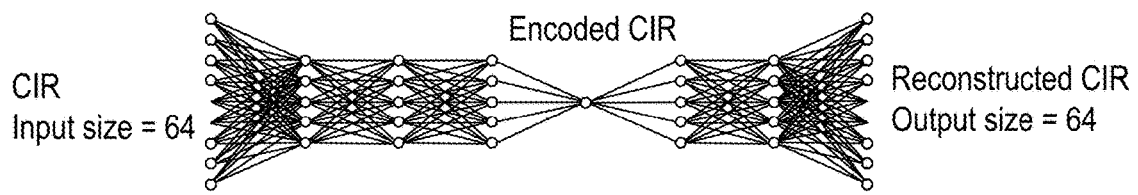
FIG. 12 shows an exemplary encoder-decoder configuration with a single node/neuron in the last encoding layer.
Figure 13:
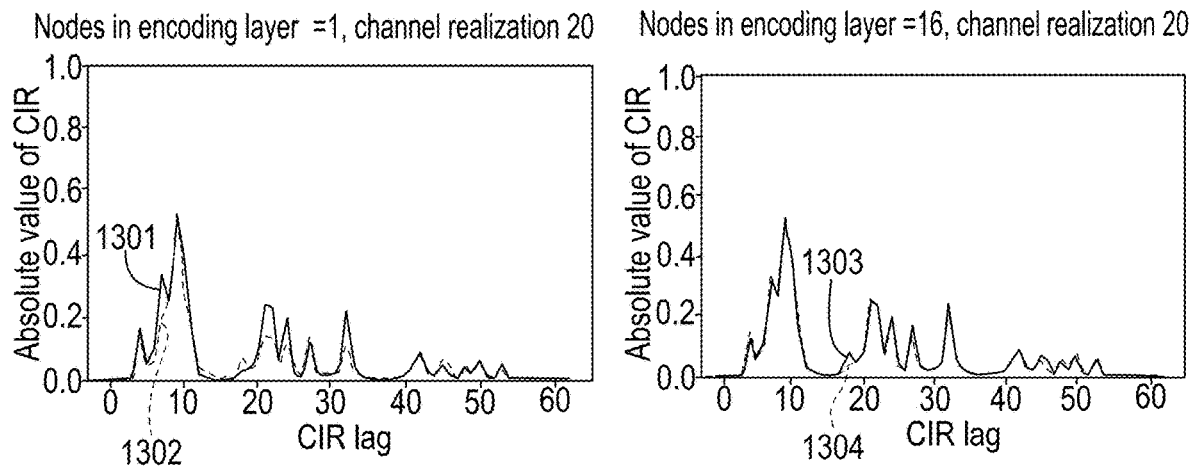
FIG. 13. shows a CIR compared to its reconstructed version for different numbers of encoding layers.

The autoencoder is trained and evaluated in an example scenario with four different channel types. The structure of the example encoder is shown in FIG. 12, where the input comprises the absolute values of the CIR. The CIR compression is first evaluated for one channel realization using different numbers of nodes in the encoding layer, where we define the encoding layer as the final layer in the encoder, (in FIG. 12, this corresponds to 1 node(neuron) for example). The value of the node(s) in the encoding layer is what the UE will signal to the network. One can see in the examples shown in FIG. 13 how the compression performance increases with the number of nodes in the encoding layer, at the cost of more reporting (16 floating point values instead of 1). The left part of FIG. 13 shows the result for one node in the encoding layer, with the original CIR delay profile 1301 and the autoencoded CIR delay profile 1302. The right part of FIG. 13 shows the result for sixteen nodes in the encoding layer, with the original CIR delay profile 1303 and the autoencoded CIR delay profile 1304.

Figure 14:
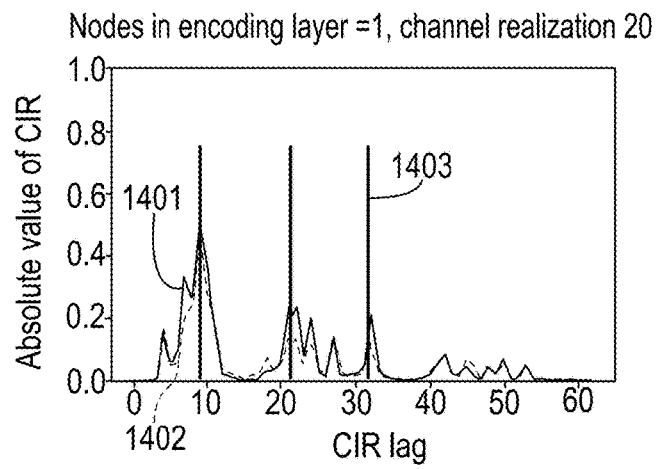
FIG. 14 shows a comparison between the proposed compression approach and an existing peak reporting method.

FIG. 14 shows a delay profile 1401 of a CIR as estimated by a UE, a reconstructed delay profile 1402 of the CIR obtained as output of the autoencoder (in other words, after compression followed by decompression), and peaks 1403 reported in the existing standard reporting scheme described above in the background section. In comparison to the existing standard peak reporting where only peak times are reported, the proposed compression of the CIR captures the structure of the CIR, as illustrated in FIG. 14. More CIR information may therefore be provided to the network node (or for example a location server), which allows for a more accurate localization at the network. In other words, a method may be provided for using autoencoders to enable more efficient reporting of channel impulse responses. Configuring or signaling an encoder (or compression function) to the UE allows the UE to signal more detailed channel information, while limiting the reporting overhead, leading to improved positioning accuracy.

Figure 15:
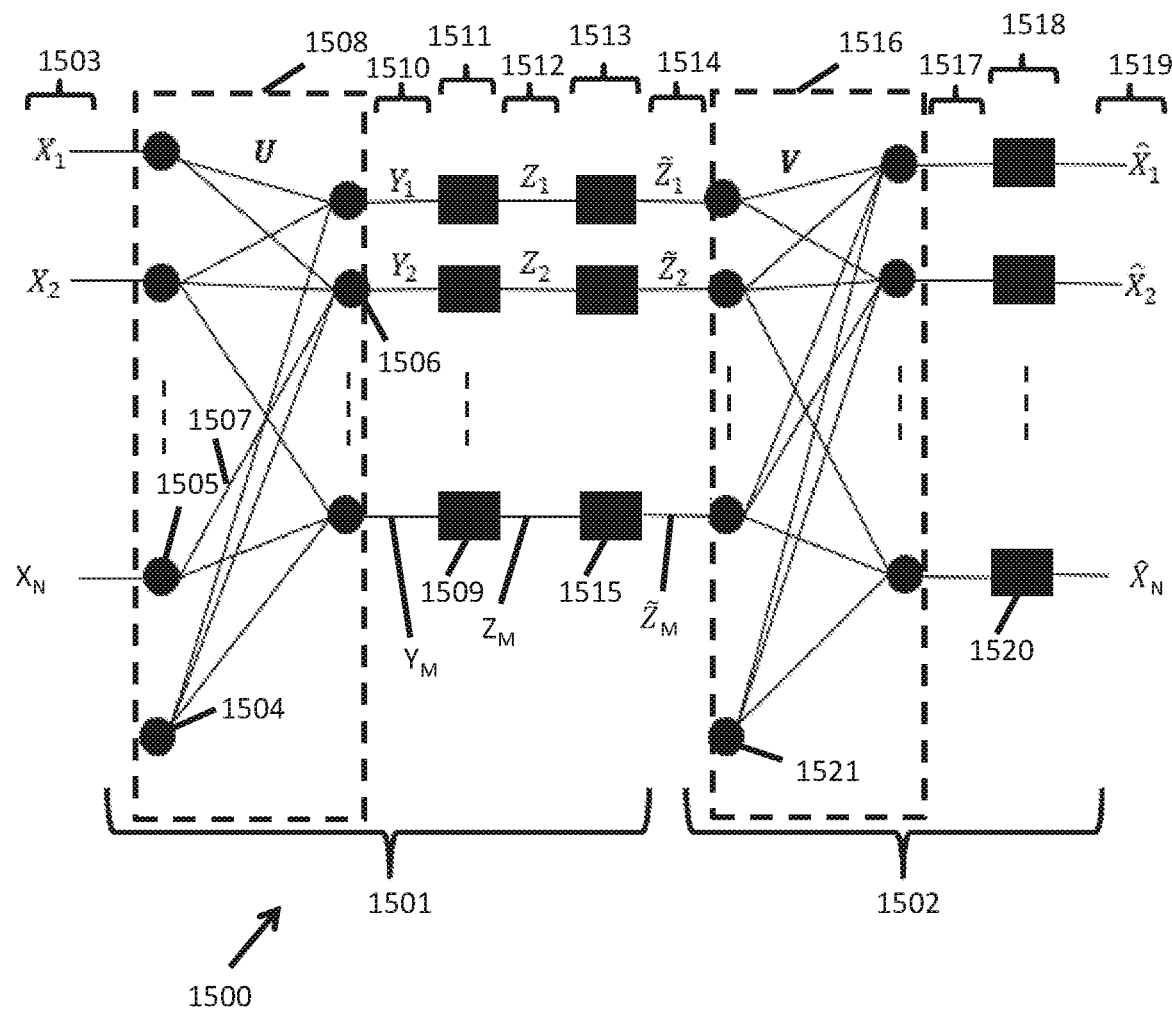
FIG. 15 shows a compression function and a decompression function provided in the form of a neural network, according an embodiment.

FIG. 15 shows a more detailed autoencoder 1500 according to an embodiment. The autoencoder 1500 is an example of a neural network. In the autoencoder 1500, a compression function 1501 performs compression of a delay profile of a CIR and a decompression function 1502 decompresses the compressed delay profile. For simplicity, assume that the delay profile 1503 is represented by N real numbers, each representing a size/amplitude/power of the CIR at a respective point in time. Let $X=[X_1, X_2, \ldots, X_N]^T$ denote the N real numbers representing the CIR delay profile 1503. The first part of the encoder (in other wards, the compression function 1501) involves a dimensionality reduction step in which the N real numbers $X=[X_1, X_2, \ldots, X_{N_{TX}}]^T$ are mapped to M real-valued numbers $Z_1, Z_2, \ldots, Z_M$ where M<N. More formally, we have $$Z = \sigma(UX+B)$$

where $X=[X_1, X_2, \ldots, X_{N_{TX}}]^T$ represents the N×1 vector of real values representing the CIR delay profile estimated by the wireless device, $B=[B_1, B_2, \ldots, B_M]^T$ denotes the M biases (equivalently represented by the input node 1504 in FIG. 15), and U is an (M×N) matrix used by the wireless device. M represents the number of values produced by the wireless device when applying the transformation UX+B (this is hence the dimension of the compressed delay profile), where M<N, meaning that U will constitute a dimension reduction. The elements of U and the biases B can be specified by a first set of parameters a configured by the network node. For example, the first set of parameters (which corresponds to encoder parameters) can be $a:=\{u_{11}, u_{12}, \ldots, u_{MN}, b_1, b_2, \ldots, b_M\}$ where $u_{ij}$ denotes the (i, j)-th element of U and $b_i$ denotes the i-th bias term. The matrix U is represented by the input nodes 1505, the hidden nodes 1506 and the paths 1507 between the nodes. The transformation UX may be regarded as a linear part 1508 of the compression function 1501. In other wards, the compression function 1501 comprises a first function UX+B which has a linear portion UX and a constant portion B. A non-linear scalar activation function (indicated by 1509 in FIG. 15) is applied to each element 1510 of the (M×1) matrix Y=UX+B. In the above equation, the combined operation of the scalar activation functions 1509 is denoted by σ. Such use of the activation function constitutes a non-linear part 1511 or subfunction of the compression function 1501. The (M×1) output Z (indicated by 1512 in FIG. 15) of this non-linear subfunction 1511 is then quantized 1513 to generate the quantized compressed measurement 1514 that is sent to the network node over the uplink represented by a finite set of bits. The activation function a is a non-linear activation function, such as sigmoid or ReLu. The scalar non-linear activation function 1509 is applied element by element to the output 1510 of the linear part 1508. The non-linear activation function 1509 can turn on/off different elements in the output from linear part 1508 to achieve better compression performance.

After the dimensionality-reduction step, the M values Z are quantized 1513 to finite-discrete values $\tilde{Z}$ for transmission over the uplink. The quantization 1513 may include a scalar or vector quantizer. For example, a scalar quantizer 1515 may be applied to each element of Z. The quantization may for example be employed together with entropy coding.

The decoder (in other words, the decompression function 1502) can be implemented in a manner like the encoder (in other words, the compression function 1501). The quantized message $\tilde{Z}$ is transmitted to the network node. The network node multiplies $\tilde{Z}$ by an N×M matrix V (this corresponds to a linear part 1516 or subfunction of the decompression function 1502), and then passes the result 1517 through a non-linear part 1518 or subfunction of the decompression function 1502 to obtain the decompressed/reconstructed delay profile 1519 denoted by $\hat{X}=[\hat{X}_1, \hat{X}_2 \ldots \hat{X}_N]^T$. The non-linear part 1518 involves application of a scalar non-linear activation function p (indicated by 1520 in FIG. 15) to the respective outputs 1517 of the linear part 1516. The activation function 1520 employed in the decompression function 1502 may for example be the same activation function 1509 as employed in the compression function 1501, but it could also be a different activation function. As in the compression function 1501, biases may be applied via use of a bias node 1521. Due to the bias node 1521, the first part (or subfunction) 1516 of the decompression function 1502 comprises a linear portion (forming linear combinations of the quantized components of the message $\tilde{Z}$) and a constant portion (provided by the bias node 1521). The elements of V and the output biases 1521 may for example be specified by a second set of parameters b.

As described above, the first function 1508 of the compression function 1501 may be controlled by a first set of parameters a, and the first function 1516 of the decompression function 1502 may be controlled by a second set of parameters b. The activation functions 1509 and 1520 at the encoder 1501 and decoder 1502 as well as the stochastic scalar quantizer 1515 are all fixed in this embodiment. Hence, the compression function 1501 could be regarded as a function $f_a$ controlled by the first set of parameters a and the decompression function 1502 could be regarded as a function $g_b$ controlled by the second set of parameters b.

Example Embodiments

In view of the above, various example embodiments are proposed.

Figure 16:
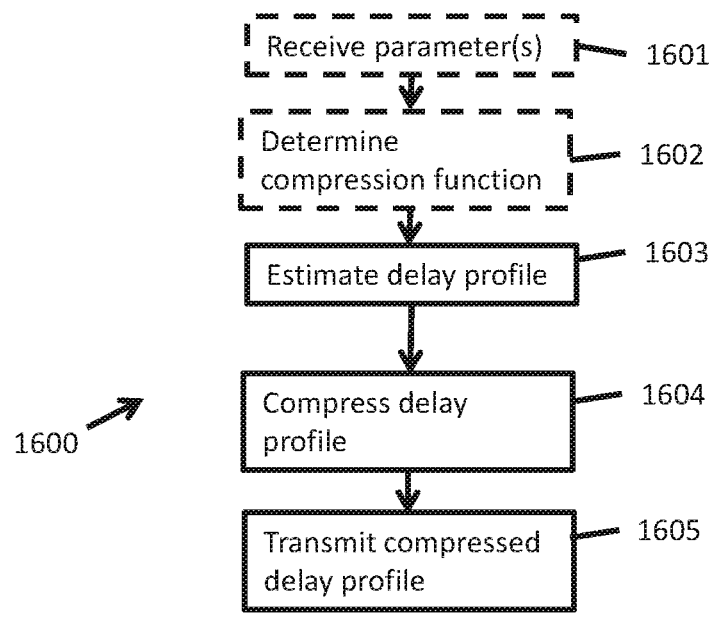
FIG. 16 is a flow chart of a method performed by a wireless device, according to an embedment.

FIG. 16 is a flow chart of a method 1600 performed by a wireless device, according to an embodiment. The method 1600 comprises estimating 1603 a delay profile of a channel impulse response (CIR) for a channel between a network node (for example a base station) and the wireless device (or for a channel from a network node to the wireless device), compressing 1604 the delay profile using a compression function, and transmitting 1605 the compressed delay profile. The compression function comprises a first function (exemplified in FIG. 15 by the function 1508) and a quantizer (exemplified in FIG. 15 by the function 1513). The first function is configured to receive input data, and to reduce a dimension of the input data. In other words, data of a first dimension may be inserted into the first function and may be reduced by the first function into data of a second dimension which is lower than the first dimension.

The wireless device performing the method 1600 may be any type of device which is able to communicate wirelessly with a network node and/or with another wireless device. The wireless device may for example be a user equipment (UE), a terminal device, a machine type communication (MTC) device, or a device capable of machine-to-machine (M2M) communication. Examples of wireless devices include, but are not limited to, smart phones, tablet computers, and USB dongles. The wireless device may for example employ one or more radio access technologies such as Bluetooth, W-Fi, GSM, UMTS, LTE, or NR to communicate with a network node.

The delay profile estimated at step 1603 and compressed at step 1604 may for example be regarded as a delay profile of the channel between the network node and the wireless device. In other words, throughout the present disclosure, a delay profile of a CIR fora channel could just as well be referred to as a delay profile of the channel.

The transmission at step 1605 may for example be a transmission to a network node (for example a location server) for estimation of a position of the wireless device.

The compression function employed at step 1604 may for example be referred to as a compressor. The use of the compression function at step 1604 comprises use of the first function and the quantizer. The first function and the quantizer may for example be regarded as parts, or portions, or subfunctions of the compression function. The quantizer may for example be referred to as a quantization function. The quantizer serves to provide output data that can be transmitted using a finite number of bits.

The compression function employed at step 1604 may for example comprise a second function (exemplified in FIG. 15 by the function 1511). The second function may for example be a non-linear function. The second function may for example be regarded as a part, or portion, or subfunction of the compression function. The second function may for example enhance a training process to find a suitable compression function. For example, such training may be enhanced compared to a situation where only linear functions are employed in the compression function. For example, suitable parameter value(s) for the compression function can be found (or optimized) by a network node during a training process. The resulting compression performance (such as the fidelity of delay profiles reconstructed at a network node after having been compressed at the wireless device using the compression function) of the optimized parameters may depend on the choice of the second function. The second function introduces nonlinearities into the compression function that allow the delay profile of a CIR to be better approximated. The second function may for example comprise a non-linear activation function. The first function may for example be configured to output a plurality of numbers (exemplified by the numbers 1510 in FIG. 15). The non-linear function may for example be configured to apply a scalar non-linear function (exemplified by the functions 1509) to each of the plurality of numbers output by the first function. The scalar non-linear function may for example be an activation function. Activation functions are often employed in machine learning, such as neural networks. An activation function may provide a "threshold" that allows things to be "tuned on" (i.e. activated) or "turned off" (i.e. deactivated). The activation function may be a scalar non-linear function (i.e., $y=f(x)$ where x and y are real numbers). A simple example might be $f(x)=0$ if $x<=0$ and $f(x)=1$ if $x>0$. This function turns x off whenever it is negative. Mother example is the sigmoid function.

The quantizer in the compression function employed at step 1604 may for example be configured to receive a plurality of numbers (for example numbers output by the second function, as exemplified in FIG. 15 by the numbers 1512, and apply scalar quantizers (exemplified in FIG. 15 by the scalar quantizers 1515) to the received numbers.

The first function in the compression function employed at step 1604 may for example be a linear function (as exemplified in FIG. 15 by the function 1508 in the case of zero bias 1504), or the first function may for example comprise a linear portion and a constant portion (as exemplified in FIG. 15 by the function 1508 in the case of non-zero bias 1504).

As indicated in FIG. 16, the method 1600 may optionally comprise receiving 1601 a first set of one or more parameters and determining 1602 the compression function based on the first set of one or more parameters. The determining of the compression function may for example comprise forming the first function based on at least one parameter from the first set of one or more parameters. One or more other parts of the compression function (such as for example the second function described above) may for example be predefined. Different compression functions may be suitable for compression of the delay profile, for example depending on factors such as properties of the wireless device itself, and/or properties of a device (such as a network node) which is intended to receive the compressed delay profile. Since the compression function is determined based on the first set of one or more parameters, these parameter(s) may be employed to control which compression function to be used at the wireless device. The set of one of more parameters is exemplified above in connection with FIG. 15 by the parameters denoted by a.

The delay profile estimated at step 1603 may for example be an amplitude delay profile of the CIR or a power delay profile of the CIR In contrast to a representation of the CIR by one or more peaks of the CIR, as described above in the background section, the delay profile of the CIR includes more information about the CIR, for example information about the size and/or shape of the CIR also between the highest peaks. The delay profile subjected to the compression at step 1604 may for example comprise a representation of the CIR in the form of numbers representing the size/magnitude/amplitude/power of the CIR at a sequence of time instances (or points in time). The time instances may for example be spaced apart by equally sized time intervals. In other words, the distance between two consecutive time instances in the sequence of time instance may be constant. In contrast, in the peak reporting described above in the background section, the reported peaks may be unevenly distributed in time, depending on where large peaks are detected in the CIR In the method 1600, the steps 1603,1604 and 1605 may for example be performed for multiple network nodes. In other words, for each of a plurality of network nodes, the method 1600 may comprise estimating 1603 a delay profile of a CIR for a channel between the network node and the wireless device, compressing 1604 the delay profile using a compression function, and transmitting 1605 the compressed delay profile. The compression 1604 of the delay profiles of the CIRs may for example be performed in a joint compression operation, or the compression 1604 of the delay profiles of the respective CIRs may for example be performed separately. A different compression function may for example be employed for a delay profile associated with a first network node than for a delay profile associated with a second network node. Alternatively, the same compression function may for example be employed for compression of each of the delay profiles.

Figure 11:
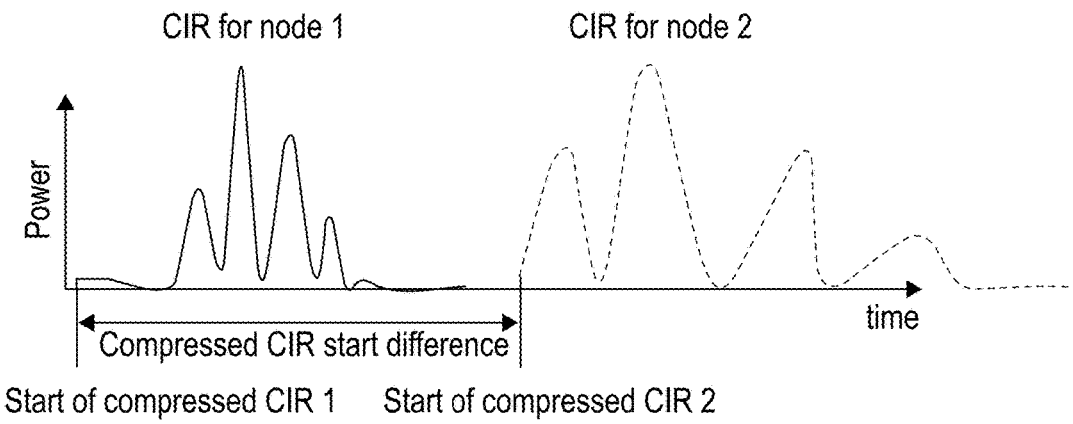
FIG. 11 shows a start difference between CIR of different nodes.

The method 1600 may for example comprise transmitting an indication of a difference in timing between the estimated 1603 delay profile of a first CIR and the estimated 1603 delay profile of a second CIR The indication of the difference in timing may for example be transmitted separately from the compressed delay profiles or together with the compressed delay profiles. The indication of the difference in timing may for example be transmitted in a compressed format or in a non-compressed format. The indication of the difference in timing may for example define a difference between a start of a first compressed delay profile and a start of a second compressed delay profile (such a difference is illustrated in FIG. 11). The indication of the difference in timing may for example define a difference between a first peak in the first delay profile (or the first peak above a threshold in the first delay profile) and a first peak in the second delay profile (or the first peak above a threshold in the first delay profile).

Figure 17:
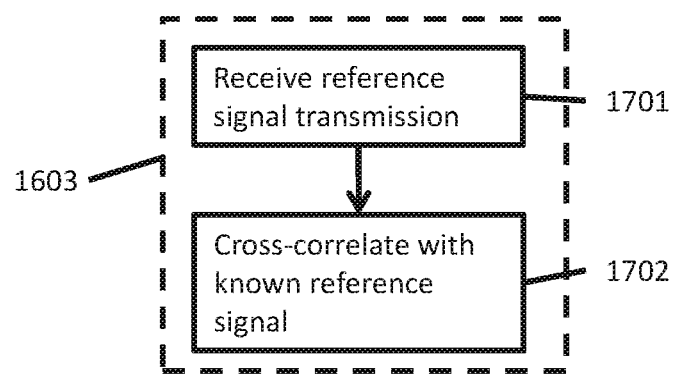
FIG. 17 shows an example of how a delay profile may be estimated in the method in FIG. 16.

As shown in FIG. 17, the step 1603 of estimating a delay profile of a CIR may for example comprise receiving 1701 a transmission of a known reference signal iron the network node, and cross-correlating 1702 the received signal transmission with the known reference signal. Such use of cross-correlation for estimating a CIR is described above in the background section. The receiving 1701 of a transmission of a known reference signal may for example be triggered by the network. The wireless device may for example be triggered via a signal from a network node (such as from a location server) to look/search for a transmission of the known reference signal.

The method 1600 may for example comprise receiving an indication whether to compress delay profiles of CIRs per receiver antenna (for example per receiver antenna of the wireless device) or whether to compress an average of delay profiles of CIRs per receiver antenna (for example per receiver antenna of the wireless device).

The method 1600 may for example comprise selecting whether to transmit the compressed delay profile or whether to transmit a representation of peaks detected in the CIR (for example the peak reporting described above in the background section). In other words, the steps 1604 and 1605 may be omitted if peak reporting is selected. The selecting may for example be based on a received instruction (for example received from a network node), and/or a signal to noise ratio (for example a signal to noise ratio measured at the wireless device or a signal to noise ratio measured at the network node), and/or a propagation environment (for example a propagation environment of the wireless device and/or of the network node and/or a propagation environment between the wireless device and the network node), and/or a number of peaks detected in the CIR (if there are only a few peaks in the CIR, all of those peaks may for example be reported and there may be no need for the compression function), and/or an estimated performance of the compression (for example estimated by the wireless device or by the network node).

Figure 18:
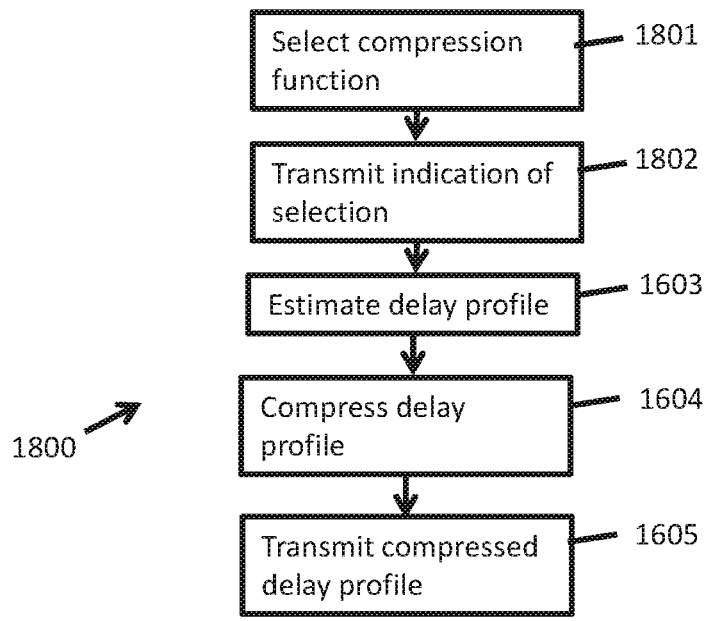
FIG. 18 is a flow chart of a method performed by a wireless device, wherein the wireless device selects a compression function, according to an embedment.

FIG. 18 is a flow chart of a method 1800 performed by a wireless device, according to an embodiment. The method 1800 comprises the steps 1603, 1604 and 1605 from the method 1600, but also comprises selecting 1801 the compression function, and transmitting 1802 (for example to the network node) an indication of the selected compression function. In other wards, the wireless device selects 1801 the compression function and informs the network (for example the network node) about the selection via the transmission 1802, so that the compressed delay profile may be decompressed by the network node. The compression function may for example be selected based on a delay spread (for example the delay spread of the channel, this can for example be estimated by using the measured CIR) and/or a bandwidth (for example a bandwidth of a detected reference signal, for example a PRS), and/or a cell size (for example a size of a cell associated with the network node or of a cell to which the network node belongs), and/or a peak-to-average ratio of the delay profile, and for a signal to noise ratio (for example a signal to noise ratio measured at the wireless device or a signal to noise ratio measured at the network node). The compression function may for example be selected based on evaluation of a collection of candidate pairs of compression functions and decompression functions, where the decompression functions are adapted for decompressing compressed delay profiles for CIRs. The evaluation may for example be performed using an objective function (such as a function to be maximized or minimized via optimization).

Figure 19:
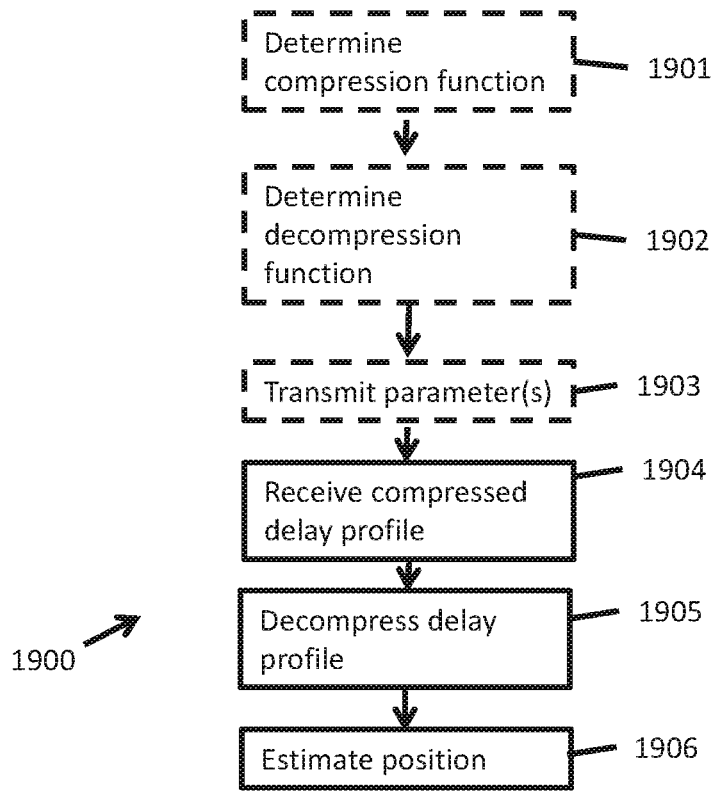
FIG. 19 is a flow chart of a method performed by a network node, according to an embodiment.

FIG. 19 is a flow chart of a method 1900 performed by a network node. The method 1900 may for example be performed by a network node in communication with a wireless device performing the method 1600 described above with reference to FIG. 16. The network node performing the method 1900 may for example be a location server, or may for example comprise a location server.

The method 1900 comprises receiving 1904 a compressed delay profile of a channel impulse response (CIR) for a channel between a network node (for example the network node performing the method 1900, or some other network node) and a wireless device, decompressing 1905 the compressed delay profile using a decompression function, and estimating 1906 a position of the wireless device based on at least the decompressed delay profile. The decompression function comprises a first function. The first function is configured to receive input data and to provide output data in a higher dimensional space than the input data. In other words, the first function is configured to receive data of a first dimension, for example in the form of M real numbers, and to output data in a space of a second dimension which is higher than the first dimension, for example in the form of N real numbers where N is larger than M. The compressed delay profile may for example be received 1904 from the wireless device, and may for example be the compressed delay profile transmitted by the wireless device at step 1605 in the method 1600. The network node performing the method 1900 may for example trigger the wireless device to estimate 1603 the delay profile so that the delay profile may be compressed 1604 and transmitted 1605 to the network node.

The network node performing the method 1900 may be any type of equipment which is able to communicate directly or indirectly with a wireless device and for with other network nodes or equipment in a wireless network to enable and/or provide wireless access to the wireless device and/or to perform other functions (e.g., administration) in the wireless network. Examples of network nodes include, but are not limited to, access points (APs) (e.g., radio access points) and base stations (BSs) (e.g., radio base stations, Node Bs, evolved Node Bs (eNBs) and NR NodeBs (gNBs)). The network node may for example employ one or more radio access technologies such as Bluetooth, W-Fi, GSM, UMTS, LTE, or NR to communicate with a wireless device.

Using the decompression function at step 1905 comprises using the first function of the decompression function. The first function of the decompression function may for example be regarded as a part, or portion or subfunction of the decompression function. The first function of the decompression function typically does not coincide with the first function of the compression function used at step 1604 of the method 1600.

The decompression function employed at step 1905 may for example further comprise a second function (exemplified in FIG. 15 by the function 1518), where the second function is a non-linear function. The second function may for example be regarded as a part, or portion, or subfunction of the decompression function, and need not necessarily be the same function as the second function of the compression function used at step 1604 of the method 1600. In analogy with the second function of the compression function used at step 1604 of the method 1600, the second function of the decompression function may for example enhance a training process to find a suitable decompression function.

The second function of the decompression function may for example comprise a non-linear activation function. The first function of the decompression function may for example be configured to output a plurality of numbers (exemplified in FIG. 15 by the numbers 1517), and the second function of the decompression function may for example be configured to apply a scalar non-linear function (exemplified in FIG. 15 by the function 1520) to each of the plurality of numbers. The scalar non-linear function may for example be an activation function.

The first function in the decompression function employed at step 1905 may for example be a linear function (exemplified in FIG. 15 by the function 1516 in case the contribution from the bias 1521 is zero), or may for example comprise a linear portion and a constant portion (exemplified in FIG. 15 by the function 1516 in case the contribution from the bias 1521 is non-zero).

As shown in FIG. 19, the method 1900 may optionally comprise determining 1901 a compression function for compressing delay profiles of CIRs at the wireless device, determining 1902 the decompression function for decompressing delay profiles of CIRs which have been compressed by the wireless device using the compression function, and transmitting 1903 a first set of one or more parameters indicating the determined compression function. The first set of one or more parameters may for example be transmitted 1903 to the wireless device which will be performing the compression (such as the wireless device performing the method 1600 in FIG. 16). The first set of one or more parameters is exemplified above in connection with FIG. 15 by the set of parameters denoted by a.

The compression function (at step 1901) and/or the decompression function (at step 1902) may for example be determined based on a delay spread, and/or a bandwidth, and/or a cell size, and/or a peak-b-average ratio of the delay profile, and/or a signal to noise ratio. The compression function (at step 1901) and/or the decompression function (at step 1902) may for example be determined based on evaluation of a collection of candidate pairs of compression functions and decompression functions. The evaluation may for example be performed using one or more neural networks (such as an autoencoder). The first set of one or more parameters transmitted at step 1903 may for example correspond to one or more weights in the one or more neural networks, as exemplified above in connection with FIG. 15 by the set of parameters denoted by a.

The method 1900 may for example comprise receiving the delay profile of the CI R, and updating the decompression function and/or the compression function based on a comparison between the delay profile as received and the delay profile as decompressed (in other words, the delay profile as obtained via the decompression step 1905). In other words, the network node performing the method 1900 may receive a version of the delay profile which has not been compressed and decompressed via the compression and decentration functions. This non-compressed version of the delay profile may be more costly to transmit, but may nevertheless be transmitted to the network node during an initial training phase, or may be transmitted less frequent than the transmission of compressed delay profiles. The non-compressed version of the delay profile may be compared with the version of the delay profile obtained at step 1905 to evaluate the performance of the compression/decompression. If the is able to provide a sufficiently accurate reconstructed version of the delay profile, then there may be no need to update the compression function and the decompression function.

The method 1900 may for example comprise estimating the delay profile of the CRI based on one or more uplink transmissions of one or more reference signals from the wireless device, and updating the decompression function and/or the compression function based on a comparison between the estimated delay profile and the decompressed delay profile (in other words, the delay profile obtained via the decompression step 1905). In other words, the network node performing the method 1900 may employ reference signals transmitted by the wireless device to estimate the delay profile, for checking the performance of the compression/decompression. This may be useful if the channel from the network node to the wireless device is similar to the channel from the wireless device to the network node experiences by the reference signals.

In the method 1900, the steps 1904 and 1905 may for example be performed for delay profiles associated with different network nodes. In other words, for each of a plurality of network nodes, the method 1900 may comprise receiving 1904 a compressed delay profile of a CIR for a channel between the network node and the wireless device, and decompressing the compressed delay profile using a decompression function. The position of the wireless device may for example be estimated based on at least the decompressed delay profiles. In other words, decompressed delay profiles associated with different network nodes (for example at least three network nodes, or at least four network nodes) may be employed for estimating 1906 the position of the wireless device.

The method 1900 may for example comprise receiving an indication of a difference in timing between the delay profile of a first CIR (for example a CIR from a first network node to the wireless device) and the delay profile of a second CIR (for example a CIR iron a second network node to the wireless device). The estimation 1906 of the position of the wireless device may for example be based on the indicated difference.

A different decompression function may for example be employed for a delay profile associated with a first network node than for a delay profile associated with a second network node. However, embodiments may also be envisaged in which the same decompression function may be employed for delay profiles associated with different network nodes.

In the method 1900, the estimation 1906 of the position of the wireless device may for example be based the decompressed delay profile and information about an environment of the wireless device (and/or information about an environment of a network node associated with the delay profile). The information about the environment of the wireless device may for example be map information.

The method 1900 may for example comprise transmitting an indication for the wireless device whether to compress delay profiles of CIRs per receiver antenna (for example per receiver antennas of the wireless device) or whether to compress an average of delay profiles of CIRs per receiver antenna (for example per receiver antennas of the wireless device).

The method 1900 may for example comprise selecting whether the wireless device shall transmit the compressed delay profile or whether the wireless device shall transmit a representation of peaks detected in the CIR The method 1900 may for example comprise transmitting an instruction indicating the selection to the wireless device. If a peak representation is selected, then the network node performing the method 1900 may estimate the position of the wireless device based on a peak representation of one or more CIRs, instead of using compressed delay profiles of the CIRs. The selecting may for example be based on a signal to noise ratio, and for a propagation environment, and/or a number of peaks detected in the CI R, and/or an estimated performance of the compression.

Figure 20:
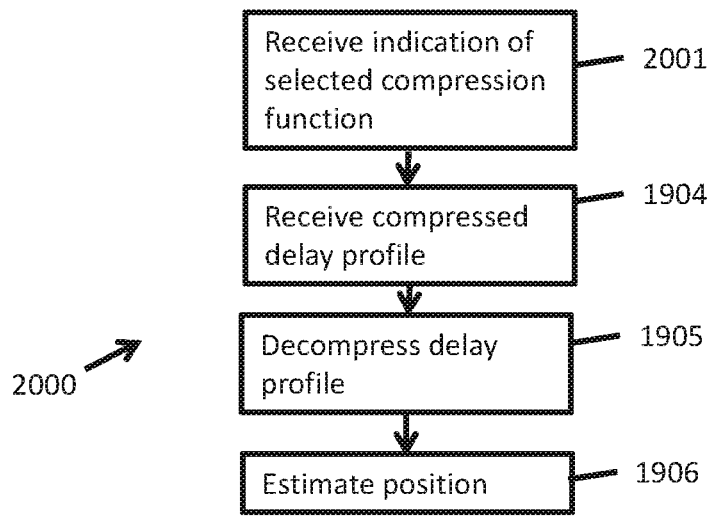
FIG. 20 is a flow chart of a method performed by a network node, wherein the network node receives an indication of a selected compression function, according to an embodiment.

FIG. 20 is a flow chart of a method 2000 performed by a network node. The method 2000 may for example be performed by a network node in communication with the wireless device performing the method 18 described above with reference to FIG. 18. The method 2000 comprises the steps 1904-1906 iron the method 1900. The method 2000 further comprises receiving 2001 an indication (for example the indication transmitted by the wireless device at step 1802 in the method 1800) of a compression function selected by the wireless device. The decompression function to be employed at step 1905 may for example be determined or selected based on the indication received at step 2001. The decompression function may for example be determined such that the decompression function is able to decompress (or is suitable for decompressing) the delay profile compressed at the wireless device using the selected compression function.

The embodiments and examples described above with reference to FIGS. 16-20 relate to positioning of a wireless device based on one or more delay profiles of one or more downlink channels iron one or more network nodes to the wireless device, where the delay profile(s) is transmitted in compressed form from the wireless device to a network node which performs the positioning. The embodiments described below with reference to FIGS. 30-31 relate to positioning of a wireless device based on one or more delay profiles of one or more uplink channels iron the wireless device to one or more network nodes, wherein the delay profile(s) is transmitted in compressed form iron a network node to another network node (such as a location server) which performs the positioning.

Figure 30:
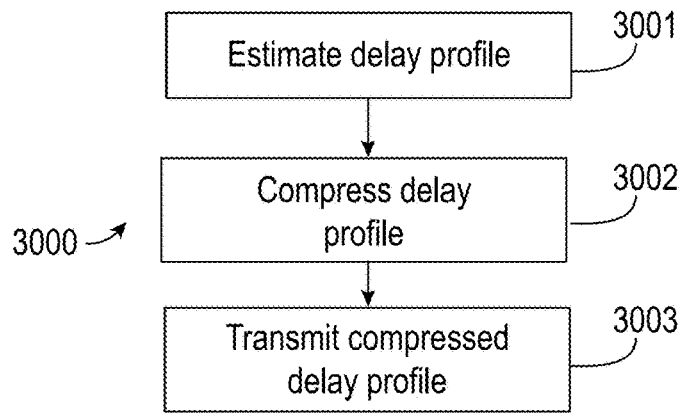
FIG. 30 is a flow chart of a method performed by a network node, the method involving compressing a delay profile of an uplink channel, according to an embodiment.

FIG. 30 is a flow chart of a method 3000 performed by a network node, according to an embodiment. The method comprises estimating 3001 a delay profile of a CIR for a channel between a wireless device and the network node (for example for a channel from a wireless device to the network node), compressing 3002 the delay profile using a compression function, and transmitting 3003 the compressed delay profile. The compression function comprises a first function and a quantizer. The first function is configured to receive input data and to reduce a dimension of the input data. It will be appreciated that the features and advantages described above with reference to FIGS. 16-18 may be employed analogously in the method 3000. For example, the method 3000 may be employed with the features of any of example embodiments 1-25 listed below in the section "Further example embodiments".

Figure 31:
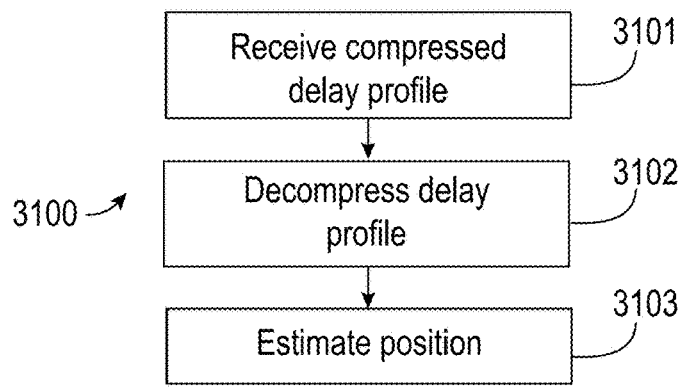
FIG. 31 is a flow chart of a method performed by a network node, the method involving decompressing a delay profile of an uplink channel, according to an embodiment.

FIG. 31 is a flow chart of a method 3100 performed by a network node (for example a location server), according to an embodiment. The method 3100 may for example be performed by a network node in communication with another network node performing the method 3000. The method 3100 comprises receiving 3101 a compressed delay profile of a CIR for a channel between a wireless device and a network node (for example for a channel from a wireless device to the network node), decompressing 3102 the compressed delay profile using a decompression function, and estimating 3103 a position of the wireless device based on at least the decompressed delay profile. The decompression function comprises a first function. The first function is configured to receive input data and to provide output data in a higher dimensional space than the input data. It will be appreciated that the features and advantages described above with reference to FIGS. 19-20 may be employed analogously in the method 3100. For example, the method 3100 may be employed with the features of any of example embodiments 26-49 listed below in the section "Further example embodiments".

Alternating Sequence of Two Types of Functions

In the autoencoder example described above with reference to FIG. 15, the compression function 1501 only has a single dimension reducing part 1508 and a single non-linear part 1511 in addition to the quantizer 1513. However, the compression function could comprise an alternating sequence of such parts, corresponding to an artificial neural network with more layers, where weighted sums are formed at the nodes, and where non-linear activation functions are applied to the weighted sums. The weights employed in the weighted sums may for example be controlled via a first set of one or more parameters received by the wireless device from the network node.

Figure 21:
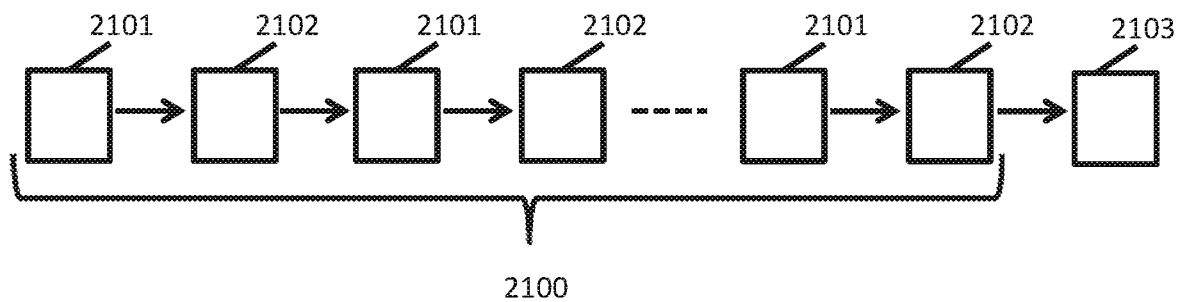
FIG. 21 shows a schematic representation of a compression function, according to an embodiment.

FIG. 21 shows a schematic representation of such a compression function, according to an embodiment. In the present embodiment, the compression function employed at step 1604 of the method 1600 (or at step 3002 in the method 3000) comprises an alternating sequence 2100 of a first type of functions 2101 and a second type of functions 2102. The first type functions 2101 are configured to receive input data, and to reduce a dimension of the input data. The second type of functions 2102 are non-linear functions. In addition to the alternating sequence 2100, the compression function also comprises a quantizer 2103.

The order of the functions in the alternating sequence 2100 of the first type of functions 2101 and the second type of functions 2102 may for example be predefined. In other words, the order of the functions in the sequence 1200 may not be affected by values of a first set of one or more parameters received by the wireless device iron the network node.

The first type of functions 2101 may for example be linear functions, or functions comprising a linear portion and a constant portion. In other words, the first type of functions 2101 could have a constant portion (or bias portion) in addition to a linear portion, in analogy with the function 1508 in FIG. 15. If there is no constant portion (or bias 1504), the first type of functions 2101 may be linear functions.

The second type of functions 2102 may for example be predefined. In other words, the second type of functions 2102 may be unaffected by values a first set of one or more parameters received by the wireless device iron the network node.

Figure 22:
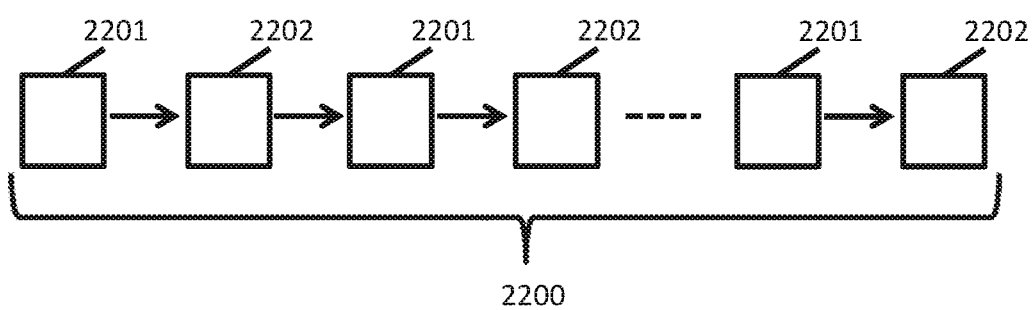
FIG. 22 shows a schematic representation of a decompression function, according to an embodiment.

In analogy with the compression function shown FIG. 21, the decompression function employed at step 1905 in the method 1900 (or at step 3102 in the method 3100) could comprise an alternating sequence of functions of a first type and functions of a second type. FIG. 22 shows a schematic representation of such a decompression function, according to an embodiment. In the present embodiment, the decompression function employed at step 1905 comprises an alternating sequence 2200 of a first type of functions 2201 and a second type of functions 2202. The second type of functions 2202 are non-linear functions. The first type of functions are configured to receive input data, and provide output data in a higher dimensional space than the input data. In contrast to the compression function shown in FIG. 21, the decompression function does not comprise a quantizer.

The order of the functions in the alternating sequence 2200 of the first type of functions 2201 and the second type of functions 2202 may for example be predefined.

The first type of functions 2201 may for example be linear functions, or functions comprising a linear portion and a constant portion. In other words, the first type of functions 2201 could have a constant portion (or bias portion) in addition to a linear portion, in analogy with the function 1516 in FIG. 15. If there is no constant portion (or bias 1521), the first type of functions 2201 may be linear functions.

The second type of functions 2202 may for example be predefined. In other words, the second type of functions 2202 may be known in advance by the network node.
Embodiments of Wireless Devices, Network Nodes, Confuter Programs Etc.

Figure 23:
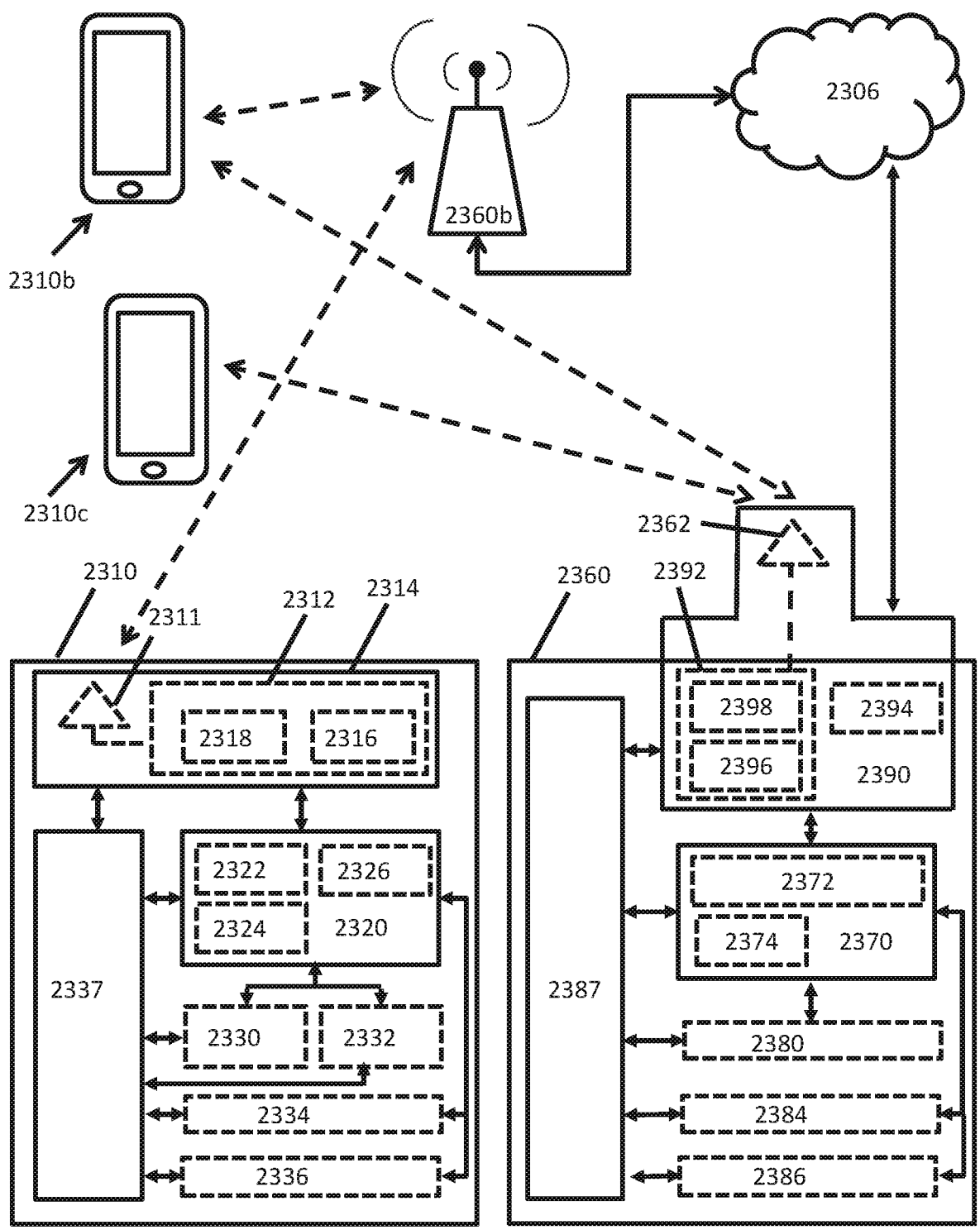
FIG. 23 shows a wireless network in accordance with some embodiments.

The methods performed by a wireless device, described above with reference to FIGS. 16-18, represent a first aspect of the present disclosure. FIG. 23 shows a wireless network and will be further described in the next section. The wireless devices 2310, 2310b and 2310c described below with reference to FIG. 23 are examples of wireless devices and represent a third aspect of the present disclosure. The wireless device 2310 (or the processing circuitry 2320 of the wireless device 2310) may for example be configured to perform the method of any of the embodiments of the first aspect described above. The wireless device 2310 (or the processing circuitry 2320 of the wireless device 2310) may for example be configured to perform the method 1600 described above with reference to FIG. 16.

According to some embodiments, the wireless device 2310 may comprise processing circuitry 2320 and a memory 2330 (or a device-readable medium) containing instructions executable by the processing circuitry 2320 whereby the wireless device 2310 is operable to perform the method of any of the embodiments of the first aspect described above.

It will be appreciated that a non-transitory computer-readable medium, such as for example the device-readable medium 2330, may store instructions which, when executed by a computer (or by processing circuitry such as 2320), cause the computer (or the processing circuitry 2320) to perform the method of any of the embodiments of the first aspect described above. It will also be appreciated that a non-transitory computer-readable medium 2330 storing such instructions need not necessarily be comprised in a wireless device 2310. On the contrary, such a non-transitory computer-readable medium 2330 could be provided on its own, for example at a location remote from the wireless device 2310.

It will be appreciated that the wireless device 2310 need not necessarily comprise all those components described below with reference to FIG. 23. For a wireless device 2310 according to an embodiment of the third aspect, it is sufficient that the wireless device 2310 comprises means for performing the steps of the method of the corresponding embodiment of the first aspect. Similarly, it will be appreciated that the processing circuitry 2320 need not necessarily comprise all those components described below with reference to FIG. 23.

The methods performed by a network node, described above with reference to FIGS. 19-20 and 30-31, represent a second aspect of the present disclosure. The network nodes 2360 and 2360b described below with reference to FIG. 23 represent a fourth aspect of the present disclosure. The network node 2360 (or the processing circuitry 2370 of the network node 2360) may for example be configured to perform the method of any of the embodiments of the second aspect described above. The network node 2360 (or the processing circuitry 2370 of the network node 2360) may for example be configured to perform the method 1900 or 2000 or 3000 or 3100 described above with reference to FIGS. 19, 20, 30, and 31, respectively.

According to an embodiment, the network node 2360 may comprise processing circuitry 2370 and a memory 2380 (or a device-readable medium) containing instructions executable by the processing circuitry 2370 whereby the network node 2360 is operable to perform the method of any of the embodiments of the second aspect described above.

It will be appreciated that a non-transitory computer-readable medium, such as for example the device-readable medium 2380, may store instructions which, when executed by a computer (or by processing circuitry such as 2370), cause the computer (or the processing circuitry 2370) to perform the method of any of the embodiments of the second aspect described above. It will also be appreciated that a non-transitory computer-readable medium 2380 storing such instructions need not necessarily be comprised in a network node 2360. On the contrary, such a non-transitory computer-readable medium 2380 could be provided on its own, for example at a location remote from the network node 2360.

It will be appreciated that the network node 2360 need not necessarily comprise all those components described below with reference to FIG. 23. For a network node 2360 according to an embodiment of the fourth aspect, it is sufficient that the network node 2360 comprises means for performing the steps of the method of the corresponding embodiment of the second aspect. Similarly, it will be appreciated that the processing circuitry 2370 need not necessarily comprise all those components described below with reference to FIG. 23.

Overview of a Wireless Network and Parts Thereof

FIG. 23 shows a wireless network in accordance with some embodiments. Although the subject matter described herein may be implemented in any appropriate type of system using any suitable components, the embodiments disclosed herein are described in relation to a wireless network, such as the example wireless network illustrated in FIG. 23. For simplicity, the wireless network of FIG. 23 only depicts network 2306, network nodes 2360 and 2360b, and WDs 2310, 2310b, and 2310c. In practice, a wireless network may further include any additional elements suitable to support communication between wireless devices or between a wireless device and another communication device, such as a landline telephone, a service provider, or any other network node or end device. Of the illustrated components, network node 2360 and wireless device (WD) 2310 are depicted with additional detail. The wireless network may provide communication and other types of services to one or more wireless devices to facilitate the wireless devices' access to and/or use of the services provided by, or via, the wireless network.

The wireless network may comprise and/or interface with any type of communication, telecommunication, data, cellular, and/or radio network or other similar type of system. In some embodiments, the wireless network may be configured to operate according to specific standards or other types of predefined rules or procedures.

Thus, particular embodiments of the wireless network may implement communication standards, such as Global System for Mobile Communications (GSM), Universal Mobile Telecommunications System (UMTS), Long Term Evolution (LTE), and/or other suitable 2G, 3G, 4G, or 5G standards; wireless local area network (WLAN) standards, such as the IEEE 802.11 standards; and/or any other appropriate wireless communication standard, such as the Worldwide Interoperability for Microwave Access (WiMax), Bluetooth, Z-Wave and/or ZigBee standards.

Network 2306 may comprise one or more backhaul networks, core networks, IP networks, public switched telephone networks (PSTNs), packet data networks, optical networks, wide-area networks (WANs), local area networks (LANs), wireless local area networks (WLANs), wired networks, wireless networks, metropolitan area networks, and other networks to enable communication between devices.

Network node 2360 and WD 2310 comprise various components described in more detail below. These components work together in order to provide network node and/or wireless device functionality, such as providing wireless connections in a wireless network. In different embodiments, the wireless network may comprise any number of wired or wireless networks, network nodes, base stations, controllers, wireless devices, relay stations, and/or any other components or systems that may facilitate or participate in the communication of data and/or signals whether via wired or wireless connections.

As used herein, network node refers to equipment capable, configured, arranged and/or operable to communicate directly or indirectly with a wireless device and/or with other network nodes or equipment in the wireless network to enable and/or provide wireless access to the wireless device and/or to perform other functions (e.g., administration) in the wireless network. Examples of network nodes include, but are not limited to, access points (APs) (e.g., radio access points), base stations (BSs) (e.g., radio base stations, Node Bs, evolved Node Bs (eNBs) and NR NodeBs (gNBs)). Base stations may be categorized based on the amount of coverage they provide (or, stated differently, their transmit power level) and may then also be referred to as femto base stations, pico base stations, micro base stations, or macro base stations. A base station may be a relay node or a relay donor node controlling a relay. A network node may also include one or more (or all) parts of a distributed radio base station such as centralized digital units and/or remote radio units (RRUs), sometimes referred to as Remote Radio Heads (RRHs). Such remote radio units may or may not be integrated with an antenna as an antenna integrated radio. Parts of a distributed radio base station may also be referred to as nodes in a distributed antenna system (DAS). Yet further examples of network nodes include multi-standard radio (MSR) equipment such as MSR BSs, network controllers such as radio network controllers (RNCs) or base station controllers (BSCs), base transceiver stations (BTSs), transmission points, transmission nodes, multi-cell/multicast coordination entities (MCEs), core network nodes (e.g., MSCs, MMEs), O&M nodes, OSS nodes, SON nodes, positioning nodes (e.g., E-SMLCs), and/or MDTs. As another example, a network node may be a virtual network node. More generally, however, network nodes may represent any suitable device (or group of devices) capable, configured, arranged, and/or operable to enable and/or provide a wireless device with access to the wireless network or to provide some service to a wireless device that has accessed the wireless network.

In FIG. 23, network node 2360 includes processing circuitry 2370, device readable medium 2380, interface 2390, auxiliary equipment 2384, power source 2386, power circuitry 2387, and antenna 2362. Although network node 2360 illustrated in the example wireless network of FIG. 23 may represent a device that includes the illustrated combination of hardware components, other embodiments may comprise network nodes with different combinations of components. It is to be understood that a network node comprises any suitable combination of hardware and/or software needed to perform the tasks, features, functions and methods disclosed herein. Moreover, while the components of network node 2360 are depicted as single boxes located within a larger box, or nested within multiple boxes, in practice, a network node may comprise multiple different physical components that make up a single illustrated component (e.g., device readable medium 2380 may comprise multiple separate hard drives as well as multiple RAM nodules).

Similarly, network node 2360 may be composed of multiple physically separate components (e.g., a NodeB component and a RNC component, or a BTS component and a BSC component, etc.), which may each have their own respective components. In certain scenarios in which network node 2360 comprises multiple separate components (e.g., BTS and BSC components), one or more of the separate components may be shared among several network nodes. For example, a single RNC may control multiple NodeB's. In such a scenario, each unique NodeB and RNC pair, may in some instances be considered a single separate network node. In some embodiments, network node 2360 may be configured to support multiple radio access technologies (RATs). In such embodiments, some components may be duplicated (e.g., separate device readable medium 2380 for the different RATs) and some components may be reused (e.g., the same antenna 2362 may be shared by the RATs). Network node 2360 may also include multiple sets of the various illustrated components for different wireless technologies integrated into network node 2360, such as, for example, GSM, WCDMA, LTE, NR, WA, or Bluetooth wireless technologies. These wireless technologies may be integrated into the same or different chip or set of chips and other components within network node 2360.

Processing circuitry 2370 is configured to perform any determining, calculating, or similar operations (e.g., certain obtaining operations) described herein as being provided by a network node. These operations performed by processing circuitry 2370 may include processing information obtained by processing circuitry 2370 by, for example, converting the obtained information into other information, Comparing the obtained information or converted information to information stored in the network node, and/or performing one or more operations based on the obtained information or converted information, and as a result of said processing making a determination.

Processing circuitry 2370 may comprise a combination of one or more of a microprocessor, controller, microcontroller, central processing unit, digital signal processor, application-specific integrated circuit, field programmable gate array, or any other suitable computing device, resource, or combination of hardware, software and/or encoded logic operable to provide, either alone or in conjunction with other network node 2360 components, such as device readable medium 2380, network node 2360 functionality. For example, processing circuitry 2370 may execute instructions stored in device readable medium 2380 or in memory within processing circuitry 2370. Such functionality may include providing any of the various wireless features, functions, or benefits discussed herein. In some embodiments, processing circuitry 2370 may include a system on a chip (SOC).

In some embodiments, processing circuitry 2370 may include one or more of radio frequency (RF) transceiver circuitry 2372 and baseband processing circuitry 2374. In some embodiments, radio frequency (RF) transceiver circuitry 2372 and baseband processing circuitry 2374 may be on separate chips (or sets of chips), boards, or units, such as radio units and digital units. In alternative embodiments, part or all of RF transceiver circuitry 2372 and baseband processing circuitry 2374 may be on the same chip or set of chips, boards, or units In certain embodiments, some oral of the functionality described herein as being provided by a network node, base station, eNB or other such network device may be performed by processing circuitry 2370 executing instructions stored on device readable medium 2380 or memory within processing circuitry 2370. In alternative embodiments, some or all of the functionality may be provided by processing circuitry 2370 without executing instructions stored on a separate or discrete device readable medium, such as in a hard-wired manner. In any of those embodiments, whether executing instructions stored on a device readable storage medium or not, processing circuitry 2370 can be configured to perform the described functionality. The benefits provided by such functionality are not limited to processing circuitry 2370 alone or to other components of network node 2360, but are enjoyed by network node 2360 as a whole, and/or by end users and the wireless network generally.

Device readable medium 2380 may comprise any form of volatile or non-volatile computer readable memory including, without limitation, persistent storage, solid-state memory, remotely mounted memory, magnetic media, optical media, random access memory (RAM), read-only memory (ROM), mass storage media (for example, a hard disk), removable storage media (for example, a flash drive, a Compact Disk (CD) or a Digital Video Disk (DVD)), and/or any other volatile or non-volatile, non-transitory device readable and/or computer-executable memory devices that store information, data, and/or instructions that may be used by processing circuitry 2370. Device readable medium 2380 may store any suitable instructions, data or information, including a computer program, software, an application including one or more of logic, rules, code, tables, etc. and/or other Instructions capable of being executed by processing circuitry 2370 and, utilized by network node 2360. Device readable medium 2380 may be used to store any calculations made by processing circuitry 2370 and/or any data received via interface 2390. In some embodiments, processing circuitry 2370 and device readable medium 2380 may be considered to be integrated.

Interface 2390 is used in the wired or wireless communication of signalling and/or data between network node 2360, network 2306, and/or WDs 2310. As illustrated, interface 2390 comprises port(s)/terminal(s) 2394 to send and receive data, for example to and from network 2306 over a wired connection. Interface 2390 also includes radio front end circuitry 2392 that may be coupled to, or in certain embodiments a part of, antenna 2362. Radio front end circuitry 2392 comprises filters 2398 and amplifiers 2396. Radio front end circuitry 2392 may be connected to antenna 2362 and processing circuitry 2370. Radio front end circuitry may be configured to condition signals communicated between antenna 2362 and processing circuitry 2370. Radio front end circuitry 2392 may receive digital data that is to be sent out to other network nodes or WDs via a wireless connection. Radio front end circuitry 2392 may convert the digital data into a radio signal having the appropriate channel and bandwidth parameters using a combination of filters 2398 and/or amplifiers 2396. The radio signal may then be transmitted via antenna 2362. Similarly, when receiving data, antenna 2362 may collect radio signals which are then converted into digital data by radio front end circuitry 2392. The digital data may be passed to processing circuitry 2370. In other embodiments, the interface may comprise different components and/or different combinations of components.

In certain alternative embodiments, network node 2360 may not include separate radio front end circuitry 2392, instead, processing circuitry 2370 may comprise radio front end circuitry and may be connected to antenna 2362 without separate radio front end circuitry 2392. Similarly, in some embodiments, all or some of RF transceiver circuitry 2372 may be considered a part of interface 2390. In still other embodiments, interface 2390 may include one or more ports or terminals 2394, radio front end circuitry 2392, and RF transceiver circuitry 2372, as part of a radio unit (not shown), and interface 2390 may communicate with baseband processing circuitry 2374, which is part of a digital unit (not shown).

Antenna 2362 may include one or more antennas, or antenna arrays, configured to send and/or receive wireless signals. Antenna 2362 may be coupled to redo front end circuitry 2392 and may be any type of antenna capable of transmitting and receiving data and/or signals wirelessly. In some embodiments, antenna 2362 may comprise one or more omni-directional, sector or panel antennas operable to transmit/receive radio signals between, for example, 2 GHz and 66 GHz. An omni-directional antenna may be used to transmit/receive radio signals in any direction, a sector antenna may be used to transmit/receive radio signals from devices within a particular area, and a panel antenna may be a line of sight antenna used to transmit/receive radio signals in a relatively straight line. In some instances, the use of more than one antenna may be referred to as MIMO. In certain embodiments, antenna 2362 may be separate from network node 2360 and may be connectable to network node 2360 through an interface or port.

Antenna 2362, interface 2390, and/or processing circuitry 2370 may be configured to perform any receiving operations and/or certain obtaining operations described herein as being performed by a network node. My information, data and/or signals may be received from a wireless device, another network node and/or any other network equipment. Similarly, antenna 2362, interface 2390, and/or processing circuitry 2370 may be configured to perform any transmitting operations described herein as being performed by a network node. Any information, data and/or signals may be transmitted to a wireless device, another network node and/or any other network equipment.

Power circuitry 2387 may comprise, or be coupled to, power management circuitry and is configured to supply the components of network node 2360 with power for performing the functionality described herein. Power circuitry 2387 may receive power from power source 2386. Power source 2386 and/or power circuitry 2387 may be configured to provide power to the various components of network node 2360 in a form suitable for the respective components (e.g., at a voltage and current level needed for each respective component). Power source 2386 may either be included in, or external to, power circuitry 2387 and/or network node 2360. For example, network node 2360 may be connectable to an external power source (e.g., an electricity outlet) via an input circuitry or interface such as an electrical cable, whereby the external power source supplies power to power circuitry 2387. As a further example, power source 2386 may comprise a source of power in the form of a battery or battery pack which is connected to, or integrated in, power circuitry 2387. The battery may provide backup power should the external power source fail. Other types of power sources, such as photovoltaic devices, may also be used.

Alternative embodiments of network node 2360 may include additional components beyond those shown in FIG. 23 that may be responsible for providing certain aspects of the network node's functionality, inducing any of the functionality described herein and/or any functionality necessary to support the subject matter described herein. For example, network node 2360 may include user interface equipment to allow input of information into network node 2360 and to allow output of information from network node 2360. This may allow a user to perform diagnostic, maintenance, repair, and other administrative functions for network node 2360.

As used herein, wireless device (WD) refers to a device capable, configured, arranged and/or operable to communicate wirelessly with network nodes and/or other wireless devices. Unless otherwise noted, the term WD may be used interchangeably herein with user equipment (UE). Communicating wirelessly may involve transmitting and/or receiving wireless signals using electromagnetic waves, radio waves, infrared waves, and/or other types of signals suitable for conveying information through air. In some embodiments, a WD may be configured to transmit and/or receive information without direct human interaction. For instance, a WD may be designed to transmit information to a network on a predetermined schedule, when triggered by an internal or external event, or in response to requests from the network. Examples of a WD include, but are not limited to, a smart phone, a mobile phone, a cell phone, a voice over IP (Vol P) phone, a wireless local loop phone, a desktop computer, a personal digital assistant (PDA), a wireless cameras, a gaming console or device, a music storage device, a playback appliance, a wearable terminal device, a wireless endpoint, a mobile station, a tablet, a laptop, a laptop-embedded equipment (LEE), a laptop-mounted equipment (LME), a smart device, a wireless customer-premise equipment (CPE). a vehicle-mounted wireless terminal device, etc. A WD may support device-b-device (D2D) communication, for example by implementing a 3GPP standard for sidelink communication, vehicle-to-vehicle (V2V), vehicle-to-infrastructure (V2I), vehicle-to-everything (V2X) and may in this case be referred to as a D2D communication device. As yet another specific example, in an Internet of Things (IoT) scenario, a WD may represent a machine or other device that performs monitoring and/or measurements, and transmits the results of such monitoring and/or measurements to another WD and/or a network node. The WD may in this case be a machine-to-machine (M2M) device, which may in a 3GPP context be referred to as an MTC device. As one particular example, the WD may be a UE implementing the 3GPP narrow band internet of things (NB-IoT) standard. Particular examples of such machines or devices are sensors, metering devices such as power meters, industrial machinery, or home or personal appliances (e.g. refrigerators, televisions, etc.) personal wearables (e.g., watches, fitness trackers, etc.). In other scenarios, a WD may represent a vehicle or other equipment that is capable of monitoring and/or reporting on its operational status or other functions associated with its operation. A WD as described above may represent the endpoint of a wireless connection, in which case the device may be referred to as a wireless terminal. Furthermore, a WD as described above may be mobile, in which case it may also be referred to as a mobile device or a mobile terminal.

As illustrated, wireless device 2310 includes antenna 2311, interface 2314, processing circuitry 2320, device readable medium 2330, user interface equipment 2332, auxiliary equipment 2334, power source 2336 and power circuitry 2337. WD 2310 may include multiple sets of one or more of the illustrated components for different wireless technologies supported by WD 2310, such as, for example, GSM, WCDMA, LTE, NR, WiFi, WiMAX, or Bluetooth wireless technologies, just to mention a few. These wireless technologies may be integrated into the same or different chips or set of chips as other components within WD 2310.

Antenna 2311 may include one or more antennas or antenna arrays, configured to send and/or receive wireless signals, and is connected to interface 2314. In certain alternative embodiments, antenna 2311 may be separate from WD 2310 and be connectable to WD 2310 through an interface or port. Antenna 2311, interface 2314, and/or processing circuitry 2320 may be configured to perform any receiving or transmitting operations described herein as being performed by a WD. My information, data and/or signals may be received from a network node and/or another WD. In some embodiments, radio front end circuitry and/or antenna 2311 may be considered an interface.

As illustrated, interface 2314 comprises radio front end circuitry 2312 and antenna 2311. Radio front end circuitry 2312 comprise one or more filters 2318 and amplifiers 2316. Radio front end circuitry 2312 is connected to antenna 2311 and processing circuitry 2320, and is configured to condition signals communicated between antenna 2311 and processing circuitry 2320. Radio front end circuitry 2312 may be coupled to or a part of antenna 2311. In some embodiments, WD 2310 may not include separate radio front end circuitry 2312; rather, processing circuitry 2320 may comprise radio front end circuitry and may be connected to antenna 2311. Similarly, in some embodiments, some or all of RF transceiver circuitry 2322 may be considered a part of interface 2314. Radio front end circuitry 2312 may receive digital data that is to be sent out to other network nodes or WDs via a wireless connection. Radio front end circuitry 2312 may convert the digital data into a radio signal having the appropriate channel and bandwidth parameters using a combination of filters 2318 and/or amplifiers 2316. The radio signal may then be transmitted via antenna 2311. Similarly, when receiving data, antenna 2311 may collect radio signals which are then converted into digital data by radio front end circuitry 2312. The digital data may be passed to processing circuitry 2320. In other embodiments, the interface may comprise different components and/or different combinations of components.

Processing circuitry 2320 may comprise a combination of one or more of a microprocessor, controller, microcontroller, central processing unit, digital signal processor, application-specific integrated circuit, field programmable gate array, or any other suitable computing device, resource, or combination of hardware, software, and/or encoded logic operable to provide, either alone or in conjunction with other WD 2310 components, such as device readable medium 2330, WD 2310 functionality. Such functionality may include providing any of the various wireless features or benefits discussed herein. For example, processing circuitry 2320 may execute instructions stored in device readable medium 2330 or in memory within processing circuitry 2320 to provide the functionality disclosed herein.

As illustrated, processing circuitry 2320 includes one or more of RF transceiver circuitry 2322, baseband processing circuitry 2324, and application processing circuitry 2326. In other embodiments, the processing circuitry may comprise different components and/or different combinations of components. In certain embodiments processing circuitry 2320 of WD 2310 may comprise a SOC. In some embodiments, RF transceiver circuitry 2322, baseband processing circuitry 2324, and application processing circuitry 2326 may be on separate chips or sets of chips. In alternative embodiments, part or all of baseband processing circuitry 2324 and application processing circuitry 2326 may be combined into one chip or set of chips, and RF transceiver circuitry 2322 may be on a separate chip or set of chips. In still alternative embodiments, part or all of RF transceiver circuitry 2322 and baseband processing circuitry 2324 may be on the same chip or set of chips, and application processing circuitry 2326 may be on a separate chip or set of chips. In yet other alternative embodiments, part or all of RF transceiver circuitry 2322, baseband processing circuitry 2324, and application processing circuitry 2326 may be combined in the same chip or set of chips. In some embodiments, RF transceiver circuitry 2322 may be a part of interface 2314. RF transceiver circuitry 2322 may condition RF signals for processing circuitry 2320.

In certain embodiments, some or all of the functionality described herein as being performed by a WD may be provided by processing circuitry 2320 executing instructions stored on device readable medium 2330, which in certain embodiments may be a computer-readable storage medium. In alternative embodiments, some or all of the functionality may be provided by processing circuitry 2320 without executing instructions stored on a separate or discrete device readable storage medium, such as in a hard-wired manner. In any of those particular embodiments, whether executing instructions stored on a device readable storage medium or not, processing circuitry 2320 can be configured to perform the described functionality. The benefits provided by such functionality are not limited to processing circuitry 2320 alone or to other components of WD 2310, but are enjoyed by WD 2310 as a whole, and/or by end users and the wireless network generally.

Processing circuitry 2320 may be configured to perform any determining, calculating, or similar operations (e.g., certain obtaining operations) described herein as being performed by a WD. These operations, as performed by processing circuitry 2320, may include processing information obtained by processing circuitry 2320 by, for example, converting the obtained information into other information, comparing the obtained information or converted information to information stored by WD 2310, and/or performing one or more operations based on the obtained information or converted information, and as a result of said processing making a determination.

Device readable medium 2330 may be operable to store a computer program, software, an application inducing one or more of logic, rules, code, tables, etc. and/or other instructions capable of being executed by processing circuitry 2320. Device readable medium 2330 may include computer memory (e.g., Random Access Memory (RAM) or Read Only Memory (ROM)), mass storage media (e.g., a hard disk), removable storage media (e.g., a Compact Disk (CD) or a Digital Video Disk (DVD)), and/or any other volatile or non-volatile, non-transitory device readable and/or computer executable memory devices that store information, data, and/or instructions that may be used by processing circuitry 2320. In some embodiments, processing circuitry 2320 and device readable medium 2330 may be considered to be integrated.

User interface equipment 2332 may provide components that allow for a human user to interact with WD 2310. Such interaction may be of many forms, such as visual, audial, tactile, etc. User interface equipment 2332 may be operable to produce output to the user and to allow the user to provide input to WD 2310. The type of interaction may vary depending on the type of user interface equipment 2332 installed in WD 2310. For example, if WD 2310 is a smart phone, the interaction may be via a touch screen; if WD 2310 is a smart meter, the interaction may be through a screen that provides usage (e.g., the number of gallons used) or a speaker that provides an audible alert (e.g., if smoke is detected). User interface equipment 2332 may include input interfaces, devices and circuits, and output interfaces, devices and circuits. User interface equipment 2332 is configured to allow input of information into WD 2310, and is connected to processing circuitry 2320 to allow processing circuitry 2320 to process the input information. User interface equipment 2332 may include, for example, a microphone, a proximity or other sensor, keys/buttons, a touch display, one or more cameras, a USB port, or other input circuitry. User interface equipment 2332 is also configured to allow output of information iron WD 2310, and to allow processing circuitry 2320 to output information from WD 2310. User interface equipment 2332 may include, for example, a speaker, a display, vibrating circuitry, a USB port, a headphone interface, or other output circuitry. Using one or more input and output interfaces, devices, and circuits, of user interface equipment 2332, WD 2310 may communicate with end users and/or the wireless network, and allow them to benefit from the functionality described herein.

Auxiliary equipment 2334 is operable to provide more specific functionality which may not be generally performed by WDs. This may comprise specialized sensors for doing measurements for various purposes, interfaces for additional types of communication such as wired communications etc. The inclusion and type of components of auxiliary equipment 2334 may vary depending on the embodiment and/or scenario.

Power source 2336 may, in some embodiments, be in the form of a battery or battery pack. Other types of power sources, such as an external power source (e.g., an electricity outlet), photovoltaic devices or power cells, may also be used WD 2310 may further comprise power circuitry 2337 for delivering power from power source 2336 to the various parts of WD 2310 which need power from power source 2336 to carry out any functionality described or indicated herein. Power circuitry 2337 may in certain embodiments comprise power management circuitry. Power circuitry 2337 may additionally or alternatively be operable to receive power iron an external power source; in which case WD 2310 may be connectable to the external power source (such as an electricity outlet) via input circuitry or an interface such as an electrical power cable. Power circuitry 2337 may also in certain embodiments be operable to deliver power from an external power source to power source 2336. This may be, for example, for the charging of power source 2336. Power circuitry 2337 may perform any formatting, converting, or other modification to the power iron power source 2336 to make the power suitable for the respective components of WD 2310 to which power is supplied.

Figure 24:
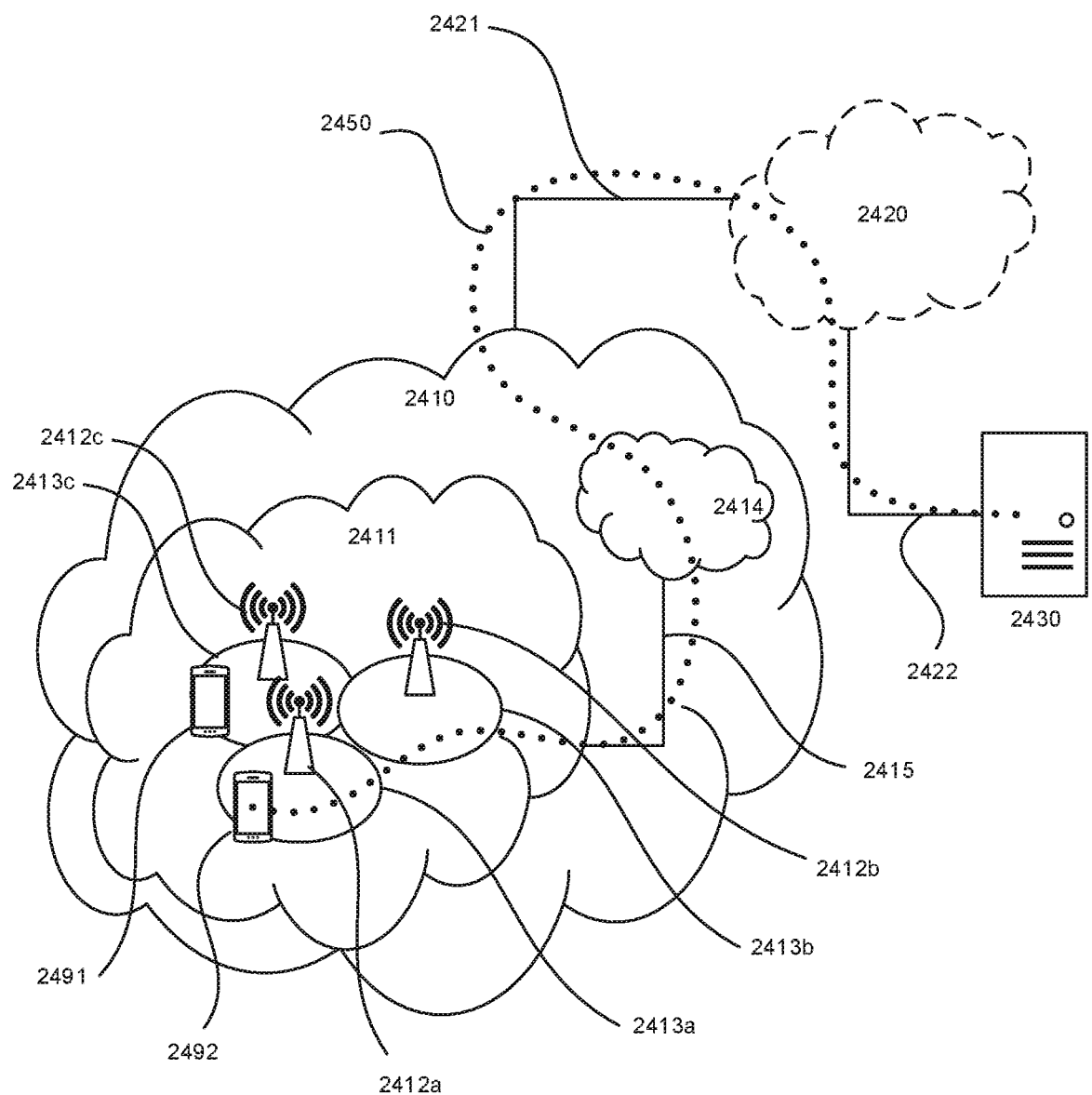
FIG. 24 shows a telecommunication network connected via an intermediate network to a host computer in accordance with some embodiments.

With reference to FIG. 24, in accordance with an embodiment, a communication system includes telecommunication network 2410, such as a 3GPP-type cellular network, which comprises access network 2411, such as a radio access network, and core network 2414. Access network 2411 comprises a plurality of base stations 2412a, 2412b, 2412c, such as NBs, eNBs, gNBs or other types of wireless access points, each defining a corresponding coverage area 2413a, 2413b, 2413c. Each base station 2412a, 2412b, 2412c is connectable to core network 2414 over a wired or wireless connection 2415. A first UE 2491 located in coverage area 2413c is configured to wirelessly connect to, or be paged by, the corresponding base station 2412c. A second UE 2492 in coverage area 2413a is wirelessly connectable to the corresponding base station 2412a. While a plurality of UEs 2491, 2492 are illustrated in this example, the disclosed embodiments are equally applicable to a situation where a sole UE is in the coverage area or where a sole UE is connecting to the corresponding base station 2412.

Telecommunication network 2410 is itself connected to host computer 2430, which may be embodied in the hardware and/or software of a standalone server, a cloud-implemented server, a distributed server or as processing resources in a server farm. Host computer 2430 may be under the ownership or control of a service provider, or may be operated by the service provider or on behalf of the service provider. Connections 2421 and 2422 between telecommunication network 2410 and host computer 2430 may extend directly from core network 2414 to host computer 2430 or may go via an optional intermediate network 2420. Intermediate network 2420 may be one of, or a combination of more than one of, a public, private or hosted network; intermediate network 2420, if any, may be a backbone network or the Internet in particular, intermediate network 2420 may comprise two or more stub-networks (not shown).

The communication system of FIG. 24 as a whole enables connectivity between the connected UEs 2491, 2492 and host computer 2430. The connectivity may be described as an over-the-top (OTT) connection 2450. Host computer 2430 and the connected UEs 2491, 2492 are configured to communicate data and/or signaling via OTT connection 2450, using access network 2411, core network 2414, any intermediate network 2420 and possible further infrastructure (not shown) as intermediaries. OTT connection 2450 may be transparent in the sense that the participating communication devices through which OTT connection 2450 passes are unaware of routing of uplink and downlink communications. For example, base station 2412 may not or need not be informed about the past routing of an incoming downlink communication with data originating from host computer 2430 to be forwarded (e.g., handed over) to a connected UE 2491. Similarly, base station 2412 need not be aware of the future routing of an outgoing uplink communication originating from the UE 2491 towards the host computer 2430.

Example implementations, in accordance with an embodiment, of the UE, base station and host computer discussed in the preceding paragraphs will now be described with reference to FIG. 25. In communication system 2500, host computer 2510 comprises hardware 2515 including communication interface 2516 configured to set up and maintain a wired or wireless connection with an interface of a different communication device of communication system 2500. Host computer 2510 further comprises processing circuitry 2518, which may have storage and/or processing capabilities. In particular, processing circuitry 2518 may comprise one or more programmable processors, application-specific integrated circuits, field programmable gate arrays or combinations of these (not shown) adapted to execute instructions. Host computer 2510 further comprises software 2511, which is stored in or accessible by host computer 2510 and executable by processing circuitry 2518. Software 2511 includes host application 2512. Host application 2512 may be operable to provide a service to a remote user, such as UE 2530 connecting via OTT connection 2550 terminating at UE 2530 and host computer 2510. In providing the service to the remote user, host application 2512 may provide user data which is transmitted using OTT connection 2550.

Communication system 2500 further includes base station 2520 provided in a telecommunication system and comprising hardware 2525 enabling it to communicate with host computer 2510 and with UE 2530. Hardware 2525 may include communication interface 2526 for setting up and maintaining a wired or wireless connection with an interface of a different communication device of communication system 2500, as well as radio interface 2527 for setting up and maintaining at least wireless connection 2570 with UE 2530 located in a coverage area (not shown in FIG. 25) served by base station 2520. Communication interface 2526 may be configured to facilitate connection 2560 to host computer 2510. Connection 2560 may be direct or it may pass through a core network (not shown in FIG. 25) of the telecommunication system and/or through one or more intermediate networks outside the telecommunication system. In the embodiment shown, hardware 2525 of base station 2520 further includes processing circuitry 2528, which may comprise one or more programmable processors, application-specific integrated circuits, field programmable gate arrays or combinations of these (not shown) adapted to execute instructions. Base station 2520 further has software 2521 stored internally or accessible via an external connection.

Communication system 2500 further includes UE 2530 already referred to. Its hardware 2535 may include radio interface 2537 configured to set up and maintain wireless connection 2570 with a base station serving a coverage area in which UE 2530 is currently located. Hardware 2535 of UE 2530 further includes processing circuitry 2538, which may comprise one or more programmable processors, application-specific integrated circuits, field programmable gate arrays or combinations of these (not shown) adapted to execute instructions. UE 2530 further comprises software 2531, which is stored in or accessible by UE 2530 and executable by processing circuitry 2538. Software 2531 includes client application 2532. Client application 2532 may be operable to provide a service to a human or non-human user via UE 2530, with the support of host computer 2510. In host computer 2510, an executing host application 2512 may communicate with the executing client application 2532 via OTT connection 2550 terminating at UE 2530 and host computer 2510. In providing the service to the user, client application 2532 may receive request data iron host application 2512 and provide user data in response to the request data. OTT connection 2550 may transfer both the request data and the user data. Client application 2532 may interact with the user to generate the user data that it provides.

Figure 25:
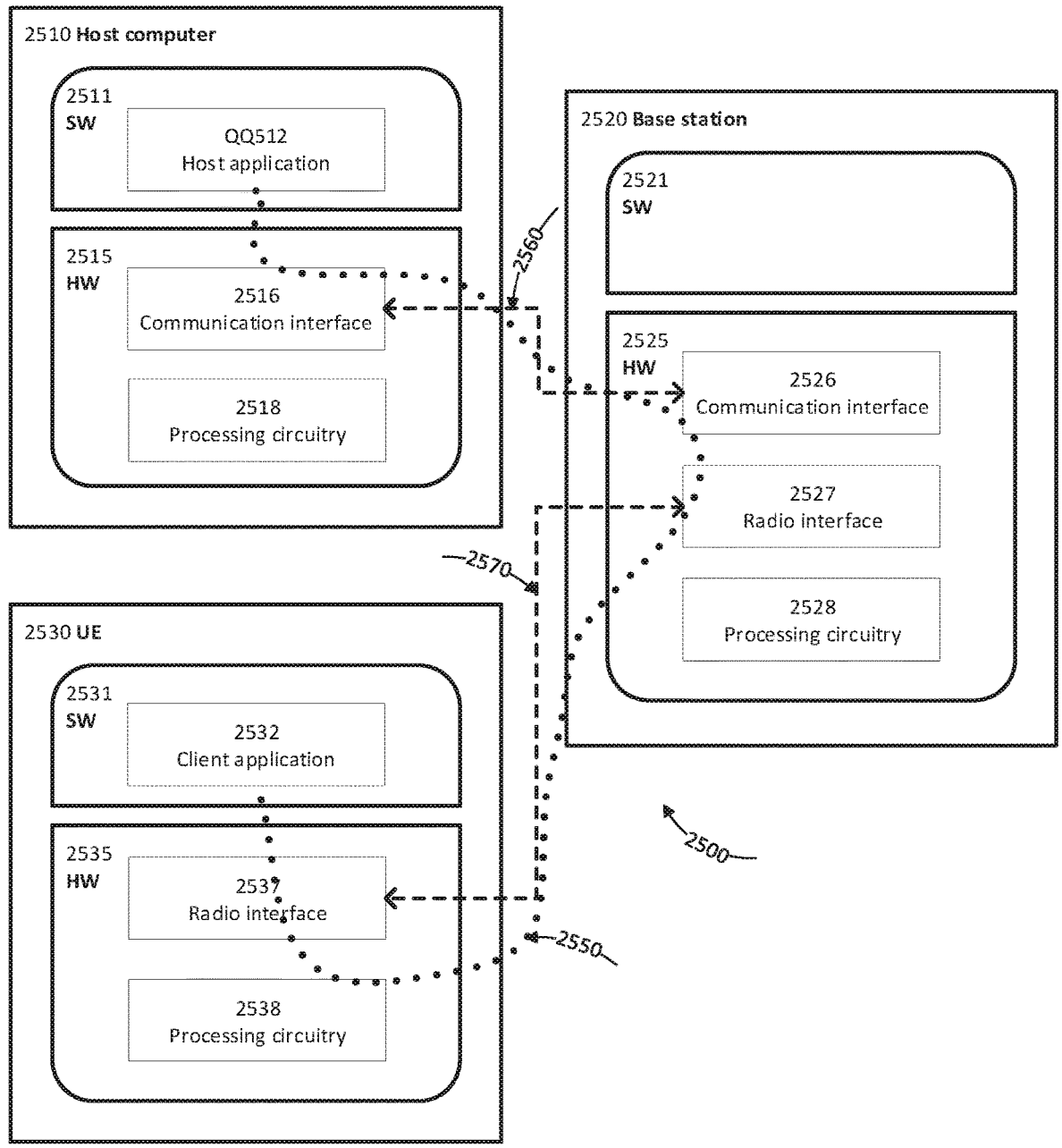
FIG. 25 shows a host computer communicating via a base station with a user equipment over a partially wireless connection in accordance with some embodiments.

It is noted that host computer 2510, base station 2520 and UE 2530 illustrated in FIG. 25 may be similar or identical to host computer 2430, one of base stations 2412*a*, 2412*b*, 2412*c* and one of UEs 2491, 2492 of FIG. 24, respectively. This is to say, the inner workings of these entities may be as shown in FIG. 25 and independently, the surrounding network topology may be that of FIG. 24.

In FIG. 25, OTT connection 2550 has been drawn abstractly to illustrate the communication between host computer 2510 and UE 2530 via base station 2520, without explicit reference to any intermediary devices and the precise routing of messages via these devices. Network infrastructure may determine the routing, which it may be configured to hide iron UE 2530 or from the service provider operating host computer 2510, or both. While OTT connection 2550 is active, the network infrastructure may further take decisions by which it dynamically changes the routing (e.g., on the basis of load balancing consideration or reconfiguration of the network).

Wireless connection 2570 between UE 2530 and base station 2520 is in accordance with the teachings of the embodiments described throughout this disclosure. One or more of the various embodiments improve the performance of OTT services provided to UE 2530 using OTT connection 2550, in which wireless connection 2570 forms the last segment More precisely, the teachings of these embodiments may improve positioning accuracy and may reduce power consumption (since the device/network may do positioning less frequently), and may thereby provide benefits such as extended battery lifetime.

A measurement procedure may be provided for the purpose of monitoring data rate, latency and other factors on which the one or more embodiments improve. There may further be an optional network functionality for reconfiguring OTT connection 2550 between host computer 2510 and UE 2530, in response to variations in the measurement results. The measurement procedure and/or the network functionality for reconfiguring OTT connection 2550 may be implemented in software 2511 and hardware 2515 of host computer 2510 or in software 2531 and hardware 2535 of UE 2530, or both. In embodiments, sensors (not shown) may be deployed in or in association with communication devices through which OTT connection 2550 passes; the sensors may participate in the measurement procedure by supplying values of the monitored quantities exemplified above, or supplying values of other physical quantities from which software 2511, 2531 may compute or estimate the monitored quantities. The reconfiguring of OTT connection 2550 may include message format, retransmission settings, preferred routing etc.; the reconfiguring need not affect base station 2520, and it may be unknown or imperceptible to base station 2520. Such procedures and functionalities may be known and practiced in the art. In certain embodiments, measurements may involve proprietary UE signaling facilitating host computer 2510's measurements of throughput, propagation times, latency and the like. The measurements may be implemented in that software 2511 and 2531 causes messages to be transmitted, in particular empty or 'dummy' messages, using OTT connection 2550 while it monitors propagation times, errors etc.

Figures 26, 27:
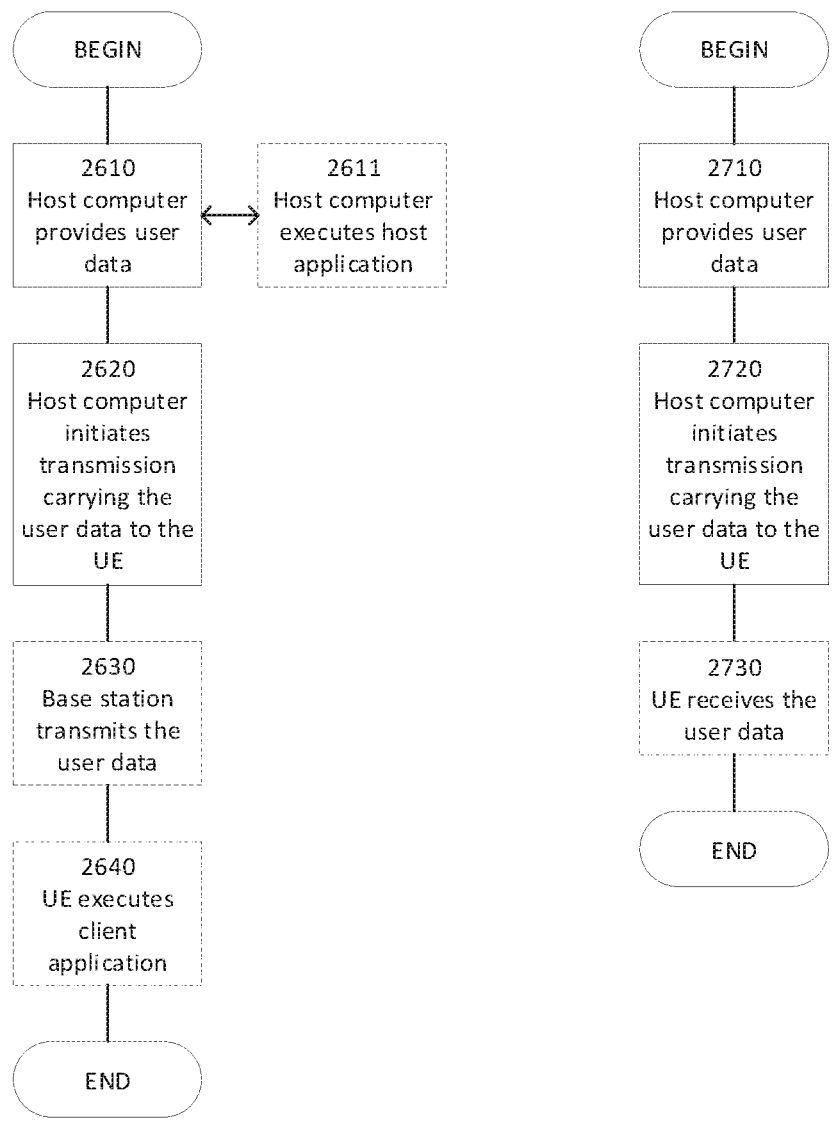
FIGS. 26-29 show methods implemented in a communication system including a host computer, a base station and a user equipment in accordance with some embodiments.

FIG. 26 is a flowchart illustrating a method implemented in a communication system, in accordance with one embodiment. The communication system includes a host computer, a base station and a UE which may be those described with reference to FIGS. 24 and 25. For simplicity of the present disclosure, only drawing references to FIG. 26 will be included in this section. In step 2610, the host computer provides user data. In substep 2611 (which may be optional) of step 2610, the host computer provides the user data by executing a host application. In step 2620, the host computer initiates a transmission carrying the user data to the UE. In step 2630 (which may be optional), the base station transmits to the UE the user data which was carried in the transmission that the host computer initiated, in accordance with the teachings of the embodiments described throughout this disclosure. In step 2640 (which may also be optional), the UE executes a client application associated with the host application executed by the host computer.

FIG. 27 is a flowchart illustrating a method implemented in a communication system, in accordance with one embodiment. The communication system includes a host computer, a base station and a UE which may be those described with reference to FIGS. 24 and 25. For simplicity of the present disclosure, only drawing references to FIG. 27 will be included in this section. In step 2710 of the method, the host computer provides user data. In an optional substep (not shown) the host computer provides the user data by executing a host application. In step 2720, the host computer initiates a transmission carrying the user data to the UE. The transmission may pass via the base station, in accordance with the teachings of the embodiments described throughout this disclosure. In step 2730 (which may be optional), the UE receives the user data carried in the transmission.

Figures 28, 29:
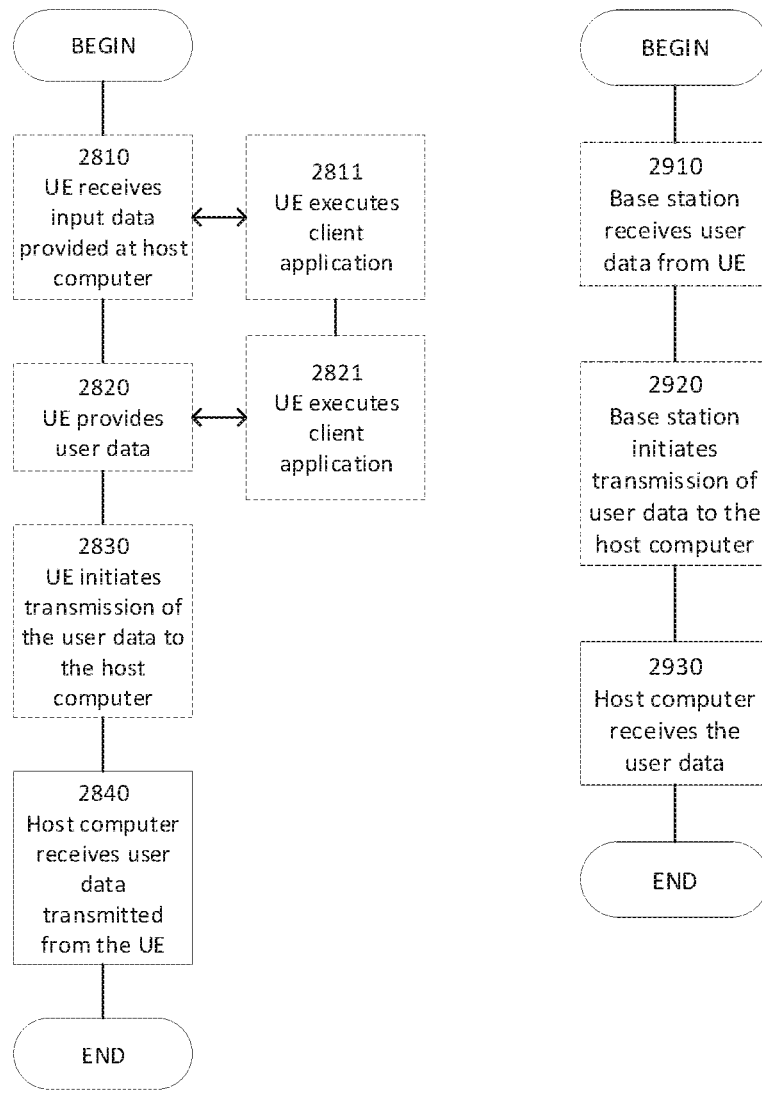

FIG. 28 is a flowchart illustrating a method implemented in a communication system, in accordance with one embodiment. The communication system includes a host computer, a base station and a UE which may be those described with reference to FIGS. 24 and 25. For simplicity of the present disclosure, only drawing references to FIG. 28 will be included in this section. In step 2810 (which may be optional), the UE receives input data provided by the host computer. Additionally or alternatively, in step 2820, the UE provides user data. In substep 2821 (which may be optional) of step 2820, the UE provides the user data by executing a client application.

In substep 2811 (which may be optional) of step 2810, the UE executes a client application which provides the user data in reaction to the received input data provided by the host computer. In providing the user data, the executed client application may further consider user input received from the user. Regardless of the specific manner in which the user data was provided, the UE initiates, in substep 2830 (which may be optional), transmission of the user data to the host computer. In step 2840 of the method, the host computer receives the user data transmitted from the UE, in accordance with the teachings of the embodiments described throughout this disclosure.

FIG. 29 is a flowchart illustrating a method implemented in a communication system, in accordance with one embodiment. The communication system includes a host computer, a base station and a UE which may be those described with reference to FIGS. 24 and 25. For simplicity of the present disclosure, only drawing references to FIG. 29 will be included in this section. In step 2910 (which may be optional), in accordance with the teachings of the embodiments described throughout this disclosure, the base station receives user data from the UE. In step 2920 (which may be optional), the base station initiates transmission of the received user data to the host computer. In step 2930 (which may be optional), the host computer receives the user data carried in the transmission initiated by the base station.

Miscellaneous

The person skilled in the art realizes that the proposed approach presented in the present disclosure is by no means limited to the preferred embodiments described above. On the contrary, many modifications and variations are possible. For example, the methods described above with reference to FIGS. 16-18 may be combined to form further embodiments. Further, it will be appreciated that the wireless device 2310 and the network node 2360 shown in FIG. 23 are merely intended as examples, and that other wireless devices and network nodes may also perform the methods described above with reference to FIGS. 16-20. It will also be appreciated that the method steps described with reference to FIGS. 16-20 need not necessarily be performed in the specific order shown in these figures, unless otherwise indicated.

The system 1500 described above with reference to FIG. 15 is intended as a simple example to illustrate the proposed compression concept. It will be appreciated that a larger system (for example using additional layers of nodes) may provide better performance.

Additionally, variations to the disclosed embodiments can be understood and effected by those sidled in the art. It will be appreciated that the word 'comprising' does not exclude other elements or steps, and that the indefinite article 'a' or 'an' does not exclude a plurality. The word "or" is not to be interpreted as an exclusive or (sometimes referred to as "XOR"). On the contrary, expressions such as "A or B" covers all the cases "A and not B", "B and not A" and "A and B". The mere fact that certain measures are recited in mutually different dependent claims does not indicate that a combination of these measures cannot be used to advantage.

Further Example Embodiments

1. A method (3000) performed by a network node (2360), the method comprising:

estimating (3001) a delay profile of a channel impulse response, CIR, for a channel between a wireless device (2310) and the network node;

compressing (3002) the delay profile using a compression function (1501); and transmitting (3003) the compressed delay profile, wherein the compression function comprises:

a first function (1508); and a quantizer (1513), wherein the first function is configured to:

receive input data (1503); and reduce a dimension of the input data.

2. The method of embedment 1, wherein the compression function further comprises a second function (1511), wherein the second function is a non-linear function.

3. The method of embodiment 2, wherein the second function comprises a non-linear activation function (1509).

4. The method of any of embodiments 2-3, wherein the first function is configured to output a plurality of numbers (1510), and wherein the non-linear function is configured to apply a scalar non-linear function (1509) to each of the plurality of numbers.

5. The method of embodiment 4, wherein the scalar non-linear function is an activation function.

6. The method of any of the preceding embodiments, further comprising:

receiving a first set of one or more parameters; and determining the compression function based on the first set of one or more parameters.

7. The method of embodiment 6, wherein determining the compression function comprises:

forming the first function based on at least one parameter from the first set of one or more parameters.

8. The method of any of the preceding embodiments, wherein the delay profile is an amplitude delay profile of the CIR or a power delay profile of the CIR.

9. The method of any of the preceding embodiments, comprising, for each of a plurality of network nodes:

obtaining (for example estimating and/or receiving) a delay profile of a CIR for a channel between a wireless device and the network node;

compressing the delay profile using a compression function; and transmitting the compressed delay profile.

10. The method of embodiment 9, wherein the method further comprises transmitting an indication of a difference in timing between the obtained delay profile of a first CIR and the obtained delay profile of a second CIR.

11. The method of any of embodiments 9-10, wherein a different compression function is employed for a delay profile associated with a first network node than for a delay profile associated with a second network node.

12. The method of any of the preceding embodiments, wherein estimating a delay profile of a CIR comprises:

receiving a transmission of a known reference signal from the wireless device; and cross-correlating the received signal transmission with the known reference signal.

13. The method of any of the preceding embodiments, further comprising:

receiving an indication whether to compress delay profiles of CIRs per receiver antenna or whether to compress an average of delay profiles of CIRs per receiver antenna.

14. The method of any of the preceding embodiments, further comprising:
   selecting whether to transmit the compressed delay profile or whether to transmit a representation of peaks detected in the CIR.
15. The method of embodiment 14, wherein the selecting is based on:
   a received instruction; and/or
   a signal to noise ratio; and/or
   a propagation environment, and/or
   a number of peaks detected in the CIR; and/or
   an estimated performance of the compression.
16. The method of any of the preceding embodiments, further comprising:
   selecting (1801) the compression function; and
   transmitting (1802) an indication of the selected compression function.
17. The method of embodiment 16, wherein the compression function is selected based on:
   a delay spread; and/or
   a bandwidth; and/or
   a cell size; and/or
   a peak-to-average ratio of the delay profile; and/or
   a signal to noise ratio.
18. The method of embodiment 16, wherein the compression function is selected based on evaluation of a collection of candidate pairs of compression functions and decompression functions, wherein the decompression functions are adapted for decompressing compressed delay profiles for CIR.
19. The method of any of the preceding embodiments, wherein:
   the first function is a linear function; or
   the first function comprises a linear portion (1505, 1507) and a constant portion (1504).
20. The method of any of the preceding embodiments, wherein the compression function comprises an alternating sequence (2100) of a first type of functions (2101) and a second type of functions (2102), wherein the first type functions are configured to:
   receive input data; and
   reduce a dimension of the input data, and wherein the second type of functions are non-linear functions.
21. The method of embodiment 20, wherein an order of the functions in the alternating sequence of a first type of functions and a second type of function is predefined.
22. The method of any of embodiments 20-21, wherein:
   the first type of functions are linear functions; or
   the first type of functions are functions comprising a linear portion and a constant portion.
23. The method of any of embodiments 20-22, wherein the second type of functions are predefined.
24. The method of any of the preceding embodiments, wherein the quantizer is configured to:
   receive a plurality of numbers (1512); and
   apply scalar quantizers (1515) to the received numbers.
25. The method of any of the preceding embodiments, further comprising:
   obtaining user data; and
   forwarding the user data to a host computer or a wireless device.
26. A method (3100) performed by a network node (2360) (for example a location server), the method comprising:
   receiving (3101) a compressed delay profile of a channel impulse response, CI R, for a channel between a wireless device (2310) and a network node (2360);
   decompressing (3102) the compressed delay profile using a decompression function (1502); and
   estimating (3103) a position of the wireless device based on at least the decompressed delay profile,
   wherein the decompression function comprises a first function (1516), and wherein the first function is configured to:
   receive input data (1514); and
   provide output data (1517) in a higher dimensional space than the input data
27. The method of embodiment 26, wherein the decompression function further comprises a second function (1518), wherein the second function is a non-linear function.
28. The method of embodiment 27, wherein the second function comprises a non-linear activation function (1520).
29. The method of any of embodiments 27-28, wherein the first function is configured to output a plurality of numbers (1517), and wherein the second function is configured to apply a scalar non-linear function (1520) to each of the plurality of numbers.
30. The method of embodiment 29, wherein the scalar non-linear function is an activation function.
31. The method of any of embodiments 26-30, further comprising:
   determining a compression function (1501) for compressing delay profiles of CIRS at a network node (for example at a different network node than the network node performing the method);
   determining the decompression function for decompressing delay profiles of CIRs which have been compressed using the compression function; and
   transmitting a first set of one or more parameters indicating the determined compression function.
32. The method of embodiment 31, wherein the compression function and/or the decompression function is determined based on:
   a delay spread; and/or
   a bandwidth; and/or
   a cell size; and/or
   a peak-to-average ratio of the delay profile; and/or
   a signal to noise ratio.
33. The method of embodiment 31, wherein the compression function and/or the decompression function is determined based on evaluation of a collection of candidate pairs of compression functions and decompression functions.
34. The method of embodiment 33, wherein the evaluation is performed using one or more neural networks (1500), and wherein the first set of one or more parameters corresponds to one or more weights in the one or more neural networks.
35. The method of any of embodiments 26-34, further comprising:
   receiving the delay profile of the CIR;
   updating the decompression function and/or the compression function based on a comparison between the delay profile as received and the delay profile as decompressed.
36. The method of any of embodiments 26-35, comprising, for each of a plurality of network nodes (for example other network nodes than the network node performing the method):
   receiving a compressed delay profile of a channel impulse response, CIR, for a channel between the wireless device and the network node (for example a different network node than the network node performing the method; and decompressing the compressed delay profile using a decompression function, wherein the position of the wireless device is estimated based on at least the decompressed delay profiles.

37. The method of embodiment 36, wherein the method further comprises receiving an indication of a difference in timing between the delay profile of a first CIR and the delay profile of a second CIR, wherein the estimation of the position of the wireless device is further based on the indicated difference.

38. The method of any of embodiments 36-37, wherein a different decompression function is employed for a delay profile associated with a first network node than for a delay profile associated with a second network node.

39. The method of any of embodiments 26-38, wherein the position of the wireless device is estimated based on at least the decompressed delay profile and information about an environment of the wireless device.

40. The method of any of embodiments 26-39, further comprising:
transmitting an indication to a network node whether to compress delay profiles of CIRs per receiver antenna or whether to compress an average of delay profiles of CIRs per receiver antenna.

41. The method of any of embodiments 26-40, further comprising:
selecting whether a network node shall transmit the compressed delay profile or whether a network node shall transmit a representation of peaks detected in the CIR and
transmitting an instruction indicating the selection to that network node.

42. The method of embodiment 41, wherein the selecting is based on:
a signal to noise ratio; and/or
a propagation environment; and/or
a number of peaks detected in the CIR and/or
an estimated performance of the compression.

43. The method of any of embodiments 26-42, further comprising:
receiving an indication of a compression function selected by a network node.

44. The method of any of embodiments 26-43, wherein:
the first function is a linear function; or
the first function comprises a linear portion and a constant portion.

45. The method of any of embodiments 26-44, wherein the decompression function comprises an alternating sequence (2200) of a first type of functions (2201) and a second type of functions (2202), wherein the second type of functions are non-linear functions, and wherein the first type of functions are configured to:
receive input data and
provide output data in a higher dimensional space than the input data.

46. The method of embodiment 45, wherein an order of the functions in the alternating sequence of a first type of functions and a second type of functions is predefined.

47. The method of any of embodiments 45-46, wherein:
the first type of functions are linear functions; or
the first type of functions are functions comprising a linear portion and a constant portion.

48. The method of any of embodiments 45-47, wherein the second type of functions are predefined.

49. The method of any of embodiments 26-48, further comprising:
obtaining user data; and
forwarding the user data to a host computer or a wireless device.

50. A network node (2360) configured to perform the method of any of embodiments 1-49.

51. A network node (2360) comprising processing circuitry (2370) and at least one memory (2380), the at least one memory containing instructions executable by the processing circuitry whereby the network node is operable to perform the method of any of embodiments 1-49.

Abbreviations

At least some of the following abbreviations may be used in this disclosure. If there is an inconsistency between abbreviations, preference should be given to how it is used above. If Nsted multiple times below, the first listing should be preferred over any subsequent listing(s).

3GPP 3rd Generation Partnership Project
5G 5th Generation
ABS Almost Blank Subframe
ARQ Automatic Repeat Request
AWGN Additive White Gaussian Noise
BCCH Broadcast Control Channel
BCH Broadcast Channel
CA Carrier Aggregation
CC Carrier Component
CCCH SDU Common Control Channel SDU
CDMA Code Division Multiplexing Access
CGI Cell Global Identifier
CIR Channel Impulse Response
CP Cyclic Prefix
CPICH Common Pilot Channel
CQI Channel Quality information
C-RNTI Cell RNTI
CSI Channel State Information
DCCH Dedicated Control Channel
DL Downlink
DM Demodulation
DMRS Demodulation Reference Signal
DRX Discontinuous Reception
DTX Discontinuous Transmission
DTCH Dedicated Traffic Channel
DUT Device Under Test
E-CID Enhanced Cell-ID (positioning method)
E-SMLC Evolved-Serving Mobile Location Centre
ECGI Evolved CGI
eNB E-UTRAN NodeB
ePDCCH enhanced Physical Downlink Control Channel
E-SMLC evolved Serving Mobile Location Center
E-UTRA Evolved UTRA
E-UTRAN Evolved UTRAN
FDD Frequency Division Duplex
FFS For Further Study
GERAN GSM EDGE Radio Access Network
gNB Base station in NR
GNSS Global Navigation Satellite System
GSM Global System for Mobile communication
HARQ Hybrid Automatic Repeat Request
HO Hangover
HSPA High Speed Packet Access
HRPD High Rate Packet Data
LOS Line of Sight
LPP LTE Positioning Protocol LTE Long-Term Evolution
MAC Medium Access Control
MBMS Multimedia Broadcast Multicast Services
MBSFN Multimedia Broadcast multicast service Single Frequency Network
MDT Minimization of Drive Tests
MIB Master Information Block
ML Machine Learning
MME Mobility Management Entity
MSC Mobile Switching Center
NR New Radio
OCNG OFDMA Channel Noise Generator
OFDM Orthogonal Frequency Division Multiplexing
OFDMA Orthogonal Frequency Division Multiple Access
OSS Operations Support System
OTDOA Observed Time Difference of Arrival
O&M Operation and Maintenance
PBCH Physical Broadcast Channel
P-CCPCH Primary Common Control Physical Channel
PCell Primary Cell
PCFICH Physical Control Format Indicator Channel
PDCCH Physical Downlink Control Channel
PDCP Packet Data Convergence Protocol
PDP Power Delay Profile
PDSCH Physical Downlink Shared Channel
PGW Packet Gateway
PHICH Physical Hybrid-ARQ Indicator Channel
PLMN Public Land Mobile Network
PMI Precoder Matrix Indicator
PRACH Physical Random Access Channel
PRS Positioning Reference Signal
PSS Primary Synchronization Signal
PUCCH Physical Uplink Control Channel
PUSCH Physical Uplink Shared Channel
RACH Random Access Channel
QAM Quadrature Amplitude Modulation
RAN Radio Access Network
RAT Radio Access Technology
RLC Radio Link Control
RLM Radio Link Management
RNC Radio Network Controller
RNTI Radio Network Temporary Identifier
RRC Radio Resource Control
RRM Radio Resource Management
RS Reference Signal
RSCP Received Signal Code Power
RSRP Reference Symbol Received Power OR Reference Signal Received Power
RSRQ Reference Signal Received Quality OR Reference Symbol Received Quality
RSSI Received Signal Strength Indicator
RSTD Reference Signal Time Difference
SCH Synchronization Channel
SCell Secondary Cell
SDAP Service Data Adaptation Protocol
SDU Service Data Unit
SFN System Frame Number
SGW Serving Gateway
SI System Information
SIB System Information Block
SNR Signal to Noise Ratio
SON Self Optimized Network
SS Synchronization Signal
SSS Secondary Synchronization Signal
TDD Time Division Duplex
TDOA Time Difference of Arrival
TOA Time of Arrival
TSS Tertiary Synchronization Signal
TTI Transmission Time Interval
UE User Equipment
UL Uplink
UMTS Universal Mobile Telecommunication System
USIM Universal Subscriber Identity Module
UTDOA Uplink Time Difference of Arrival
UTRA Universal Terrestrial Radio Access
UTRAN Universal Terrestrial Radio Access Network
WCDMA Wide CDMA
WLAN Wide Local Area Network

The invention claimed is:

1. A method performed by a wireless device, the method comprising:
   estimating a delay profile of a channel impulse response, CIR, for a channel between a network node and the wireless device;
   compressing the delay profile using a compression function; and
   transmitting the compressed delay profile; and
   the compression function comprising:
      a first function; and
      a quantizer, the first function being configured to:
         receive input data; and
         reduce a dimension of the input data.

2. The method of claim 1, wherein the compression function further comprises a second function, wherein the second function comprises a non-linear activation function.

3. The method of claim 1, further comprising:
   receiving a first set of one or more parameters; and
   determining the compression function based on the first set of one or more parameters.

4. The method of claim 3, wherein determining the compression function comprises:
   forming the first function based on at least one parameter from the first set of one or more parameters.

5. The method of claim 1, wherein the delay profile is an amplitude delay profile of the CIR or a power delay profile of the CIR.

6. The method of claim 1, comprising, for each of a plurality of network nodes:
   estimating a delay profile of a CIR for a channel between the network node and the wireless devices;
   compressing the delay profile using a compression function; and
   transmitting the compressed delay profile.

7. The method of claim 6, wherein a different compression function is employed for a delay profile associated with a first network node than for a delay profile associated with a second network node.

8. The method of claim 1, wherein estimating a delay profile of a CIR comprises:
   receiving a transmission of a known reference signal from the network node; and
   cross-correlating the received signal transmission with the known reference signal.

9. The method of claim 1, further comprising:
   selecting the compression function; and
   transmitting an indication of the selected compression function.

10. The method of claim 9, wherein the compression function is selected based on one or more of:
   a delay spread;
   a bandwidth;
   a cell size;
   a peak-to-average ratio of the delay profile; and
   a signal to noise ratio.

11. The method of claim 9, wherein the compression function is selected based on evaluation of a collection of candidate pairs of compression functions and decompression functions, wherein the decompression functions are adapted for decompressing compressed delay profiles for CIR.

12. The method of claim 1, wherein the compression function comprises an alternating sequence of a first type of functions and a second type of functions, wherein:
the first type functions are configured to:
receive input data; and
reduce a dimension of the input data;
wherein the second type of functions are non-linear functions, wherein an order of the functions in the alternating sequence of a first type of functions and a second type of function is predefined, wherein one of:
the first type of functions are linear functions; and
the first type of functions are functions comprising a linear portion and a constant portion; and
wherein the second type of functions are predefined.

13. A method performed by a network node, the method comprising:
receiving a compressed delay profile of a channel impulse response, CIR, for a channel between a network node and a wireless device;
decompressing the compressed delay profile using a decompression function;
estimating a position of the wireless device based on at least the decompressed delay profile;
the decompression function comprising a first function; and
the first function being configured to:
receive input data; and
provide output data in a higher dimensional space than the input data.

14. The method of claim 13, wherein the decompression function further comprises a second function, wherein the second function comprises a non-linear activation function.

15. The method of claim 13, further comprising:
determining a compression function for compressing delay profiles of CIRs at the wireless device;
determining the decompression function for decompressing delay profiles of CIRs which have been compressed by the wireless device using the compression function; and
transmitting a first set of one or more parameters indicating the determined compression function.

16. The method of claim 15, wherein the compression function and/or the decompression function is determined based on one or more of:
a delay spread;
a bandwidth;
a cell size;
a peak-to-average ratio of the delay profile; and
a signal to noise ratio.

17. The method of claim 15, wherein one or more of the compression function and the decompression function is determined based on evaluation of a collection of candidate pairs of compression functions and decompression functions.

18. The method of claim 17, wherein the evaluation is performed using one or more neural networks, and wherein the first set of one or more parameters corresponds to one or more weights in the one or more neural networks.

19. A wireless device comprising processing circuitry and at least one memory, the at least one memory containing instructions executable by the processing circuitry to cause the wireless device to:
estimate a delay profile of a channel impulse response, CIR, for a channel between a network node and the wireless device;
compress the delay profile using a compression function;
transmit the compressed delay profile; and
the compression function comprising:
a first function; and
a quantizer, the first function being configured to:
receive input data; and
reduce a dimension of the input data.

20. A network node comprising processing circuitry and at least one memory, the at least one memory containing instructions executable by the processing circuitry to cause the network node to:
receive a compressed delay profile of a channel impulse response, CIR, for a channel between a network node and a wireless device;
decompress the compressed delay profile using a decompression function;
estimate a position of the wireless device based on at least the decompressed delay profile; and
the decompression function comprising a first function, the first function being configured to:
receive input data; and
provide output data in a higher dimensional space than the input data.

* * * * *